(12) United States Patent
Chen et al.

(10) Patent No.: US 10,770,335 B2
(45) Date of Patent: Sep. 8, 2020

(54) SUBSTRATE SUPPORTING APPARATUS

(71) Applicant: ACM Research (Shanghai) Inc., Shanghai (CN)

(72) Inventors: Fufa Chen, Shanghai (CN); Zhiyou Fang, Shanghai (CN); Jun Wu, Shanghai (CN); Hui Wang, Shanghai (CN); Fuping Chen, Shanghai (CN); Wenjun Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 0 days.

(21) Appl. No.: 16/315,507

(22) PCT Filed: Jul. 6, 2016

(86) PCT No.: PCT/CN2016/088754
§ 371 (c)(1),
(2) Date: Jan. 4, 2019

(87) PCT Pub. No.: WO2018/006283
PCT Pub. Date: Jan. 11, 2018

(65) Prior Publication Data
US 2019/0311938 A1 Oct. 10, 2019

(51) Int. Cl.
*H01L 21/687* (2006.01)
*H01L 21/683* (2006.01)
(Continued)

(52) U.S. Cl.
CPC .... *H01L 21/6838* (2013.01); *H01L 21/67051* (2013.01); *H01L 21/67109* (2013.01);
(Continued)

(58) Field of Classification Search
CPC .......... H01L 21/6838; H01L 21/68728; H01L 21/67109; H01L 21/67751;
(Continued)

(56) References Cited

FOREIGN PATENT DOCUMENTS

| CN | 104813460 A | 7/2015 |
|---|---|---|
| CN | 105318129 A | 2/2016 |

(Continued)

OTHER PUBLICATIONS

International Search Report issued in International Application No. PCT/CN2016/088754 dated Mar. 8, 2017 (4 pages).
(Continued)

*Primary Examiner* — Sunil K Singh
*Assistant Examiner* — Paul M Janeski
(74) *Attorney, Agent, or Firm* — Osha Liang LLP

(57) ABSTRACT

A substrate supporting apparatus (300) for cleaning a back side of a substrate (107) is provided. The substrate supporting apparatus (300) has a hollow shaft (319) and a rotary spindle (303). The rotary spindle (303) is set in the hollow shaft (319) and a spacing is formed between an outer wall of the rotary spindle (303) and an inner wall of the hollow shaft (319). The outer wall of the rotary spindle (303) defines a blocking wall (322) and a recess (324) to prevent particles in the spacing from entering a gas groove (325) which is formed on the hollow shaft (319) and supplies gas to a front side of the substrate (107), avoiding the particles contaminating the front side of the substrate (107), which improves the quality of semiconductor devices.

10 Claims, 31 Drawing Sheets

(51) Int. Cl.
*H01L 21/67* (2006.01)
*H01L 21/677* (2006.01)
(52) U.S. Cl.
CPC .. *H01L 21/67751* (2013.01); *H01L 21/68707* (2013.01); *H01L 21/68728* (2013.01); *H01L 21/68735* (2013.01); *H01L 21/68764* (2013.01); *H01L 21/68785* (2013.01); *H01L 21/68792* (2013.01)
(58) Field of Classification Search
CPC ......... H01L 21/68707; H01L 21/68792; H01L 21/68785; H01L 21/68764; H01L 21/68735; H01L 21/67051
See application file for complete search history.

(56) References Cited

FOREIGN PATENT DOCUMENTS

| | | | |
|---|---|---|---|
| JP | 2005332889 | A | 12/2005 |
| WO | 2015184628 | A1 | 12/2015 |

OTHER PUBLICATIONS

Written Opinion issued in International Application No. PCT/CN2016/088754 dated Mar. 8, 2017 (3 pages).

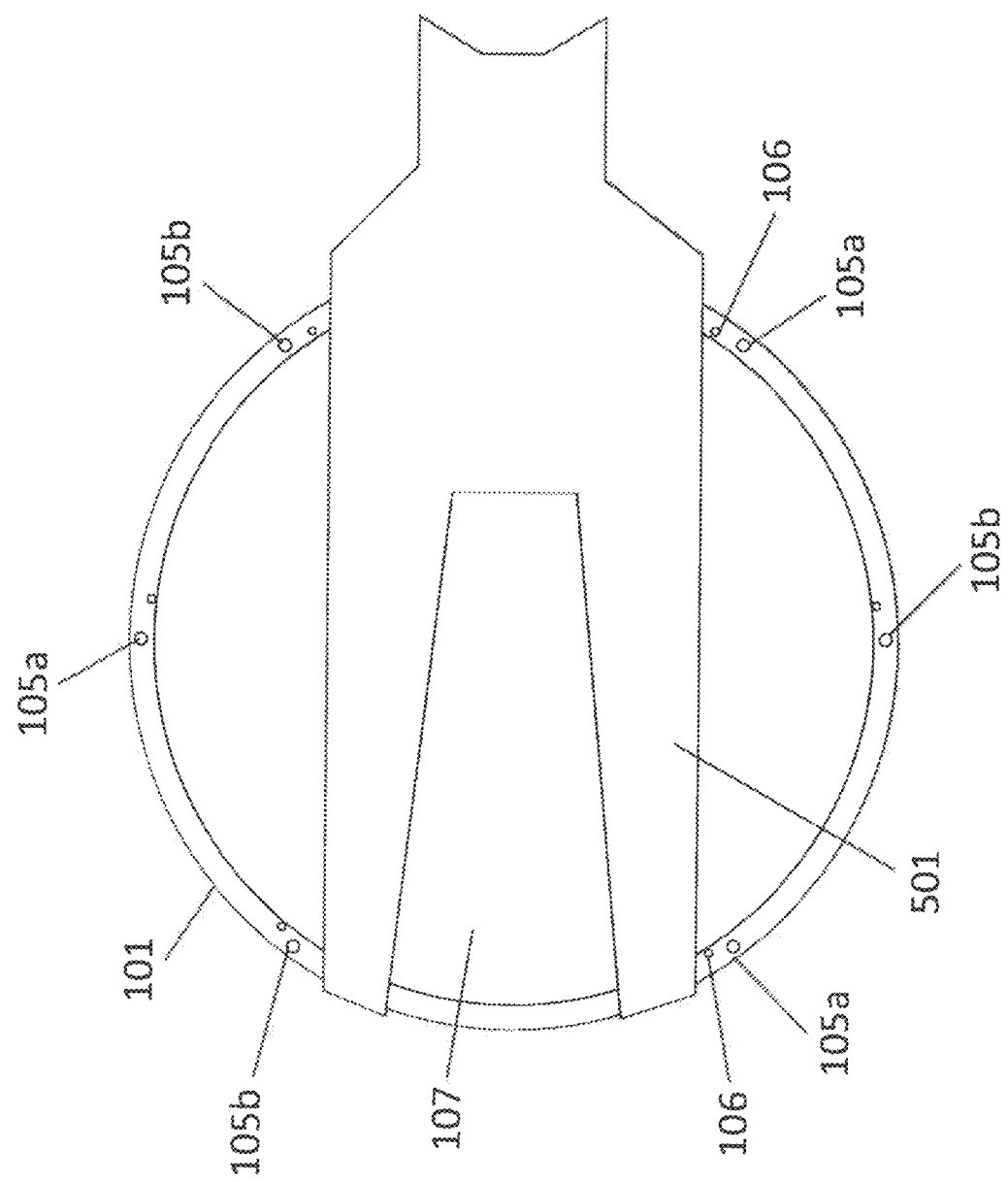

SUBSTRATE SUPPORTING APPARATUS

BACKGROUND OF THE INVENTION

1. Field of the Invention

The present invention generally relates to a substrate processing apparatus, and more particularly to a substrate supporting apparatus making use of Bernoulli principle for supporting a substrate, such as a semiconductor wafer during cleaning, etching, developing, photo resist coating or removing process.

2. The Related Art

During a semiconductor device fabrication process, most treating processes used for manufacturing the semiconductor device, such as cleaning, etching, developing, photo resist coating or removing, focus on the substrate device side also referred to as the front side of the substrate. However, the substrate backside (non-device side) processing such as cleaning and etching is just as important. Contaminations attached on the backside of the substrate can cause for example photolithography steps defocus on the pattern formed on the front side of the substrate, and also can contaminate the substrate processing apparatus thereby contaminating other substrates processed by the same apparatus. Thereinto, backside metallic contaminations can diffuse through the substrate and contaminate the front side of the substrate, which would induce the semiconductor device electrical failure.

In order to ensure the quality of the semiconductor device, it is essential to clean the backside of the substrate. For cleaning the backside of the substrate, an apparatus is needed to support the substrate. Such apparatus has been known from U.S. Pat. No. 5,492,566. The apparatus comprises an annular nozzle in a circular surface of the apparatus. The nozzle is fed with compressed gas for the formation of a gas cushion between the apparatus and the substrate. The substrate is sucked above the apparatus by Bernoulli principle and keeps in a floating state. At least one projection in the apparatus topside surface serves as a rest for the substrate during processing. In the apparatus, the lower surface of the substrate facing the apparatus needs to keep contact with the projection. For the substrate backside processing, the substrate device side (front side) needs to face the apparatus topside surface. The projection may cause the device side pattern broken, and the gap height between the substrate and the apparatus topside surface is not to easily adjust.

Another apparatus for supporting a substrate is disclosed in U.S. Pat. No. 6,669,808. The apparatus provides a proximity suction member above a rotary base member having a support member supporting a substrate. The proximity suction member downwardly and outwardly injects gas from a support surface thereof to the overall peripheral edge of an upper surface of the substrate supported by the support member. The support surface being a lower surface of the proximity suction member is located on a plane substantially parallel to the substrate on the rotary base member. A processing solution supply part supplies the processing solution to a lower surface of the substrate supported and rotated on the rotary base member. Also the gap height between the lower surface of the substrate and the rotary base member topside surface is not easily to adjust. Besides the cleaning efficiency may be not so good because of the processing solution supply model.

SUMMARY

Accordingly, an object of the present invention is to provide a substrate supporting apparatus having a rotatable chuck, a first mass flow controller, a second mass flow controller, a plurality of locating pins and guiding pillars, and a motor. The rotatable chuck for supporting a substrate defines a plurality of first injecting ports and second injecting ports. The first injecting ports are connected with a first gas passage for supplying gas to the substrate and sucking the substrate by Bernoulli effect. The second injecting ports are connected with a second gas passage for supplying gas to the substrate and lifting the substrate. The first mass flow controller is installed on the first gas passage for controlling the flow of the gas supplied to the first injecting ports. The second mass flow controller is installed on the second gas passage for controlling the flow of the gas supplied to the second injecting ports. The plurality of locating pins are disposed at the top surface of the rotatable chuck for preventing the substrate horizontal movement when the substrate has a predefined process. The plurality of guiding pillars are disposed at the top surface of the rotatable chuck and every guiding pillar protrudes to form a holding portion for holding the substrate. The motor is used for rotating the rotatable chuck.

A gap is formed between the lower surface of the substrate and the top surface of the rotatable chuck, avoiding the lower surface of the substrate contacting with the top surface of the rotatable chuck thereby contaminating the lower surface of the substrate, and the height of the gap can be adjusted by controlling the flow of the gas supplied to the first injecting ports and the second injecting ports and the substrate can keep in a stably floating state by Bernoulli principle.

Another object of the present invention is to provide a substrate supporting apparatus having a rotatable chuck, a plurality of locating pins, a hollow shaft, a rotary spindle, and two pairs of seal rings. The rotatable chuck is used for supporting a substrate and defines a plurality of first injecting ports and a plurality of second injecting ports. The first injecting ports connect to a gas pipe for supplying gas to the substrate and sucking the substrate by Bernoulli effect. The second injecting ports connect to another gas pipe for supplying gas to the substrate and lifting the substrate. The plurality of locating pins is disposed at the top surface of the rotatable chuck. The plurality of locating pins is divided into a first group of locating pins and a second group of locating pins. Every locating pin is driven by an independent cylinder. The cylinders which drive the first group of locating pins connect to a gas pipe. The cylinders which drive the second group of locating pins connect to another gas pipe. An inner wall of the hollow shaft defines four gas grooves and every gas groove is corresponding to one gas pipe for supplying gas to the gas pipe. The rotary spindle is set in the hollow shaft and a spacing is formed between an outer wall of the rotary spindle and the inner wall of the hollow shaft. One pair of seal rings is disposed at opposite sides of one gas groove which supplies gas to the cylinders for driving the first group of locating pins. One pair of seal rings is disposed at opposite sides of one gas groove which supplies gas to the cylinders for driving the second group of locating pins. Wherein the hollow shaft defines an exhaust port between two adjacent gas grooves. One gas groove supplies gas to the cylinders for driving the first group of locating pins or the second group of locating pins, and one gas groove supplies gas to the first injecting ports or the second injecting ports. The outer wall of the rotary spindle defines a blocking wall corresponding to the exhaust port of the hollow shaft and a recess matching the gas groove which supplies gas to the first injecting ports or the second injecting ports.

The present invention utilizes the blocking wall and the recess defined on the outer wall of the rotary spindle to prevent particles in the spacing from entering the gas groove which is formed on the hollow shaft and supplies gas to a front side of the substrate, avoiding the particles contaminating the front side of the substrate, which improves the quality of semiconductor devices.

BRIEF DESCRIPTION OF THE DRAWINGS

The present invention will be apparent to those skilled in the art by reading the following description of a preferred embodiment thereof, with reference to the attached drawings, in which:

FIG. 5 is a top view showing an end-effector putting/getting a substrate on/from the substrate supporting apparatus;

DETAILED DESCRIPTION OF EMBODIMENTS

Figure 1:
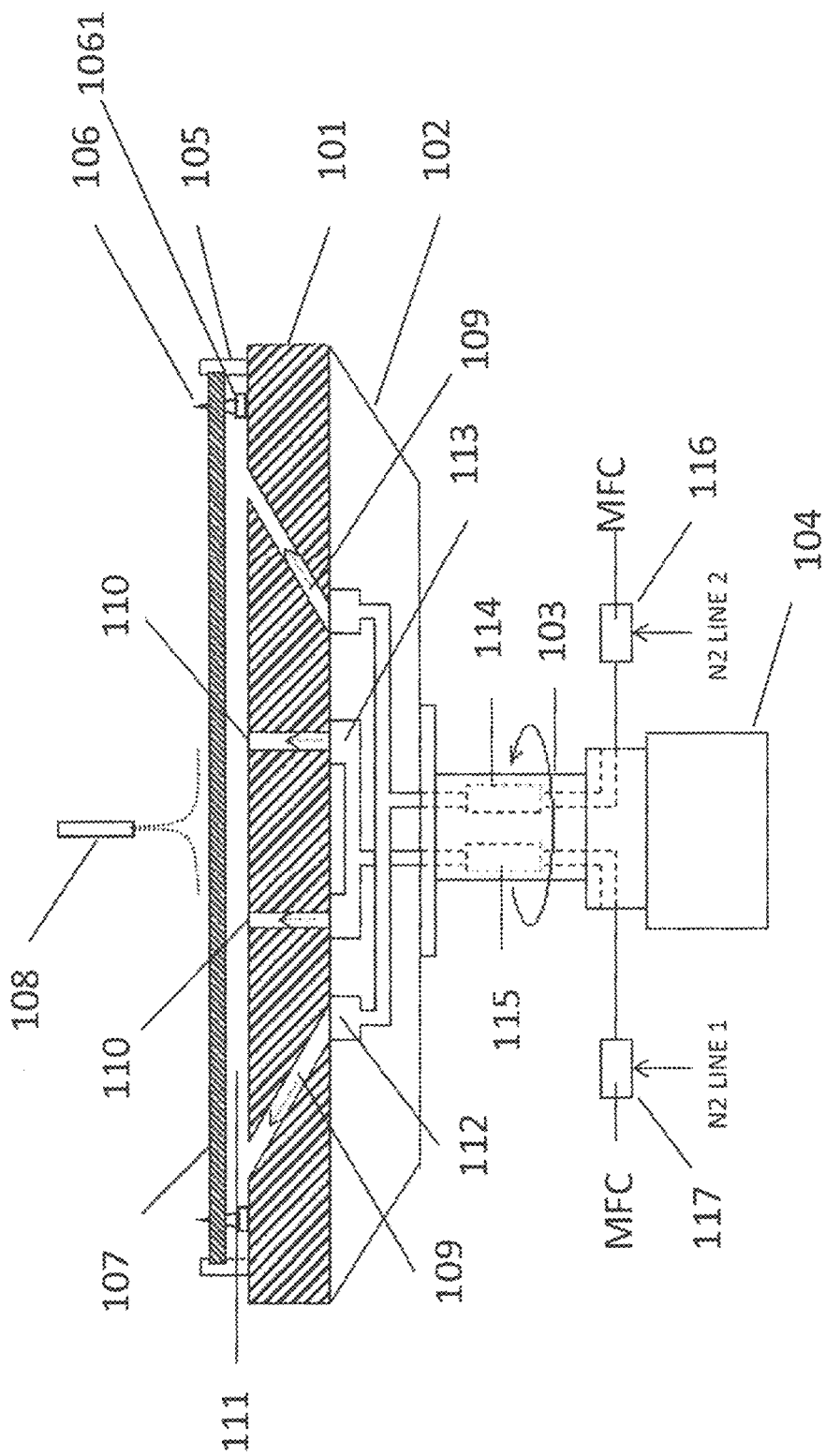
FIG. 1 is a sectional view of an exemplary substrate supporting apparatus according to the present invention.
Figure 2:
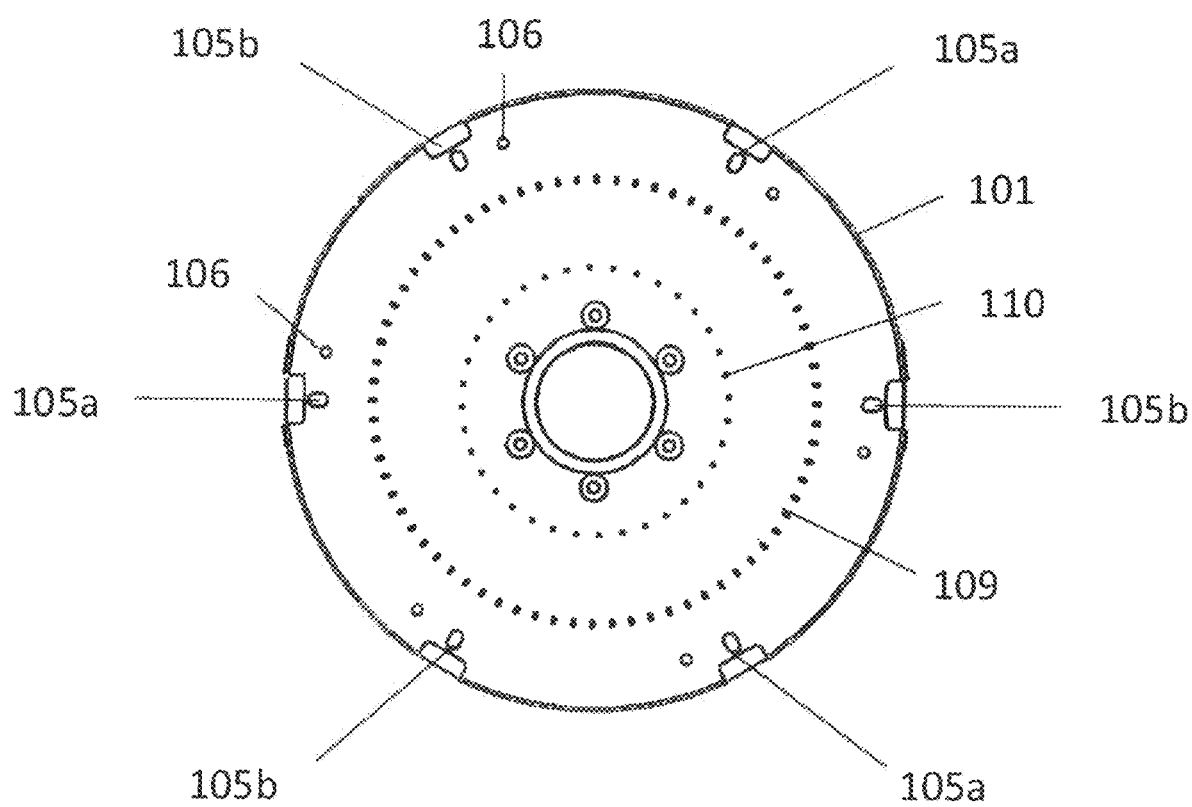
FIG. 2 is a top view of the substrate supporting apparatus.
Figure 3A:
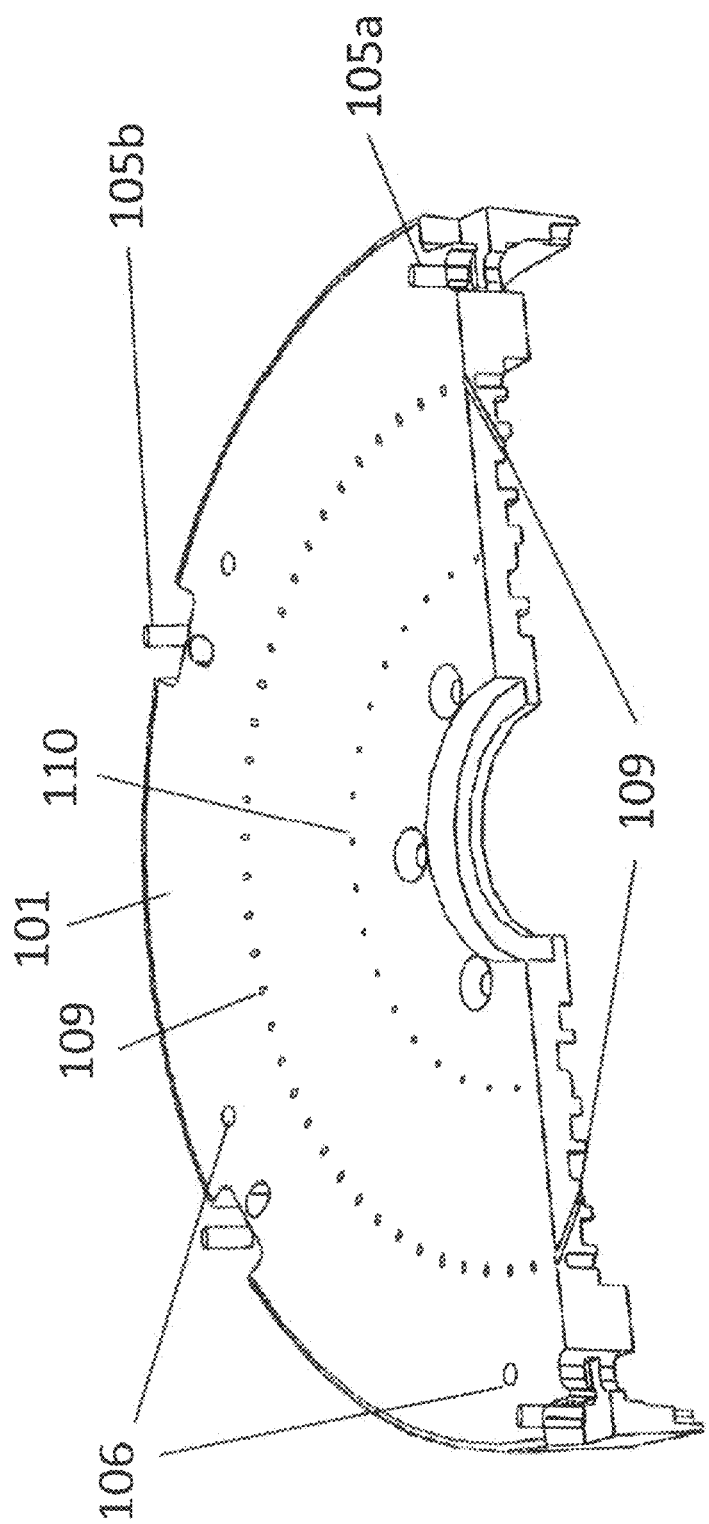
FIGS. 3A and 3B are cross-sectional views of the substrate supporting apparatus shown in FIG. 2.
Figure 3B:
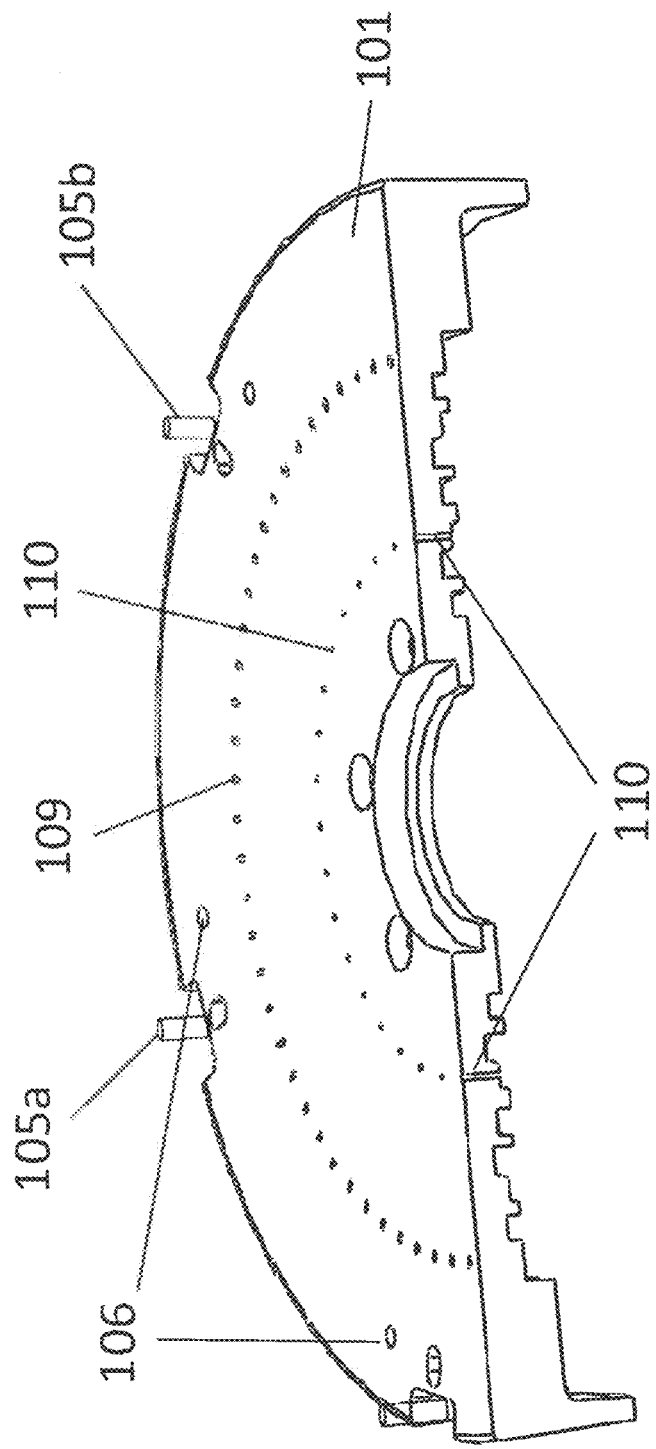
Figure 4:
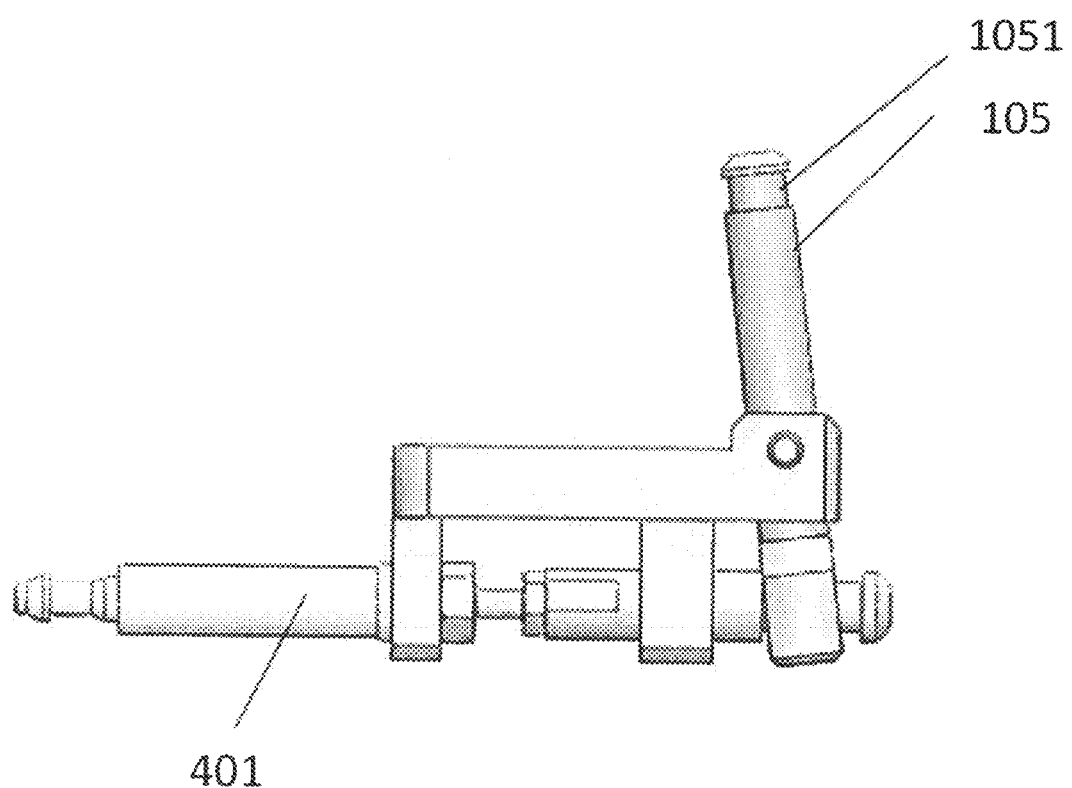
FIG. 4 is a perspective view of a locating pin of the substrate supporting apparatus.

Referring to FIGS. 1 to 4, a substrate supporting apparatus of the present invention is illustrated. The substrate supporting apparatus includes a rotatable chuck 101 which is optimally circular for supporting a disk-shaped article, for example, a semiconductor wafer for processing the semiconductor wafer. A hollow housing 102 is disposed below the rotatable chuck 101 and connected to the bottom surface of the rotatable chuck 101. A rotary spindle 103 is provided to connect the hollow housing 102. The rotary spindle 103 is hollow. The upper end of the rotary spindle 103 is fixed with the bottom of the hollow housing 102 and the lower end of the rotary spindle 103 is fixed with a motor 104 for rotating the rotary spindle 103 and thereby rotating the rotatable chuck 101 around a vertical axis.

A plurality of, e.g., six locating pins 105 are disposed at the outer edge of the top surface of the rotatable chuck 101 uniformly for preventing a substrate 107 horizontal movement when the substrate 107 has a predefined process such as a cleaning process. Every locating pin 105 defines a locating groove 1051 on the upper end thereof. The peripheral edge of the substrate 107 is engaged with the locating groove 1051 for restricting the substrate 107 horizontal movement. Every locating pin 105 is driven by an independent cylinder 401 to move inwardly to position the substrate 107 or outwardly to release the substrate 107. All of the locating pins 105 are divided into two groups 105a, 105b which are disposed alternately. During the substrate 107 cleaning process, the two groups of locating pins 105a, 105b alternately position the substrate 107 so that the peripheral edge of the substrate 107 can be cleaned completely. That is to say, during the substrate 107 cleaning process, the first group of locating pins 105a position the substrate 107 firstly, during this time, the second group of locating pins 105b keep a non-contact state with the substrate 107, after the substrate 107 is cleaned for a period of time, the first group of locating pins 105a release the substrate 107 and the second group of locating pins 105b position the substrate 107. It should be recognized that the substrate 107 can be positioned by the second group of locating pins 105b firstly.

A plurality of, e.g., six guiding pillars 106 are disposed at the outer edge of the top surface of the rotatable chuck 101. Every guiding pillar 106 is adjacent to a corresponding locating pin 105. The guiding pillar 106 is in cone shape so the side surface of the guiding pillar 106 serves as a guiding surface for guiding the substrate 107 to be put on the rotatable chuck 101 exactly. The bottom of the guiding pillar 106 protrudes outwardly to form a holding portion 1061 for holding the substrate 107 when the substrate 107 is put on the rotatable chuck 101 so a gap 111 is formed between the lower surface of the substrate 107 and the top surface of the rotatable chuck 101, avoiding the lower surface of the substrate 107 contacting with the top surface of the rotatable chuck 101 thereby contaminating the lower surface of the substrate 107.

The rotatable chuck 101 defines a plurality of first injecting ports 109 and second injecting ports 110 passing therethrough. The first injecting ports 109 are defined on a circle on the rotatable chuck 101 and far away from the center of the rotatable chuck 101. Every first injecting port 109 is inclined and formed an angle with respect to the bottom surface of the rotatable chuck 101. The second injecting ports 110 are defined on a circle on the rotatable chuck 101 and close to the center of the rotatable chuck 101. Every second injecting port 110 is vertical and perpendicular to the rotatable chuck 101. Every first injecting port 109 is connected to a first gas pipe 112 and every second injecting port 110 is connected to a second gas pipe 113. Both the first gas pipe 112 and the second gas pipe 113 are received in the hollow housing 102 respectively. The first gas pipe 112 and the second gas pipe 113 respectively pass through the hollow housing 102 and are received in the rotary spindle 103. A first filter 114 is disposed in the first gas pipe 112 for purifying the gas supplied to the substrate 107 through the first injecting ports 109. A second filter 115 is disposed in the second gas pipe 113 for purifying the gas supplied to the substrate 107 through the second injecting ports 110. The first gas pipe 112 is connected to a first gas tube disposed outside the substrate supporting apparatus and connected to a gas source. The first gas pipe 112 and the first gas tube are formed a first gas passage connecting with the first injecting ports 109 for supplying the gas to the first injecting ports 109. A first mass flow controller (MFC) 116 is installed on the first gas passage for controlling the flow of the gas supplied to the first injecting ports 109. Specially, the first mass flow controller 116 is installed on the first gas tube for controlling the flow of the gas supplied to the first gas pipe 112. The juncture place of the first gas pipe 112 and the first gas tube is sealed by a magnetic fluid for preventing the gas leak. The second gas pipe 113 is connected to a second gas tube disposed outside the substrate supporting apparatus and connected to a gas source. The second gas pipe 113 and the second gas tube are formed a second gas passage connecting with the second injecting ports 110 for supplying the gas to the second injecting ports 110. A second mass flow controller 117 is installed on the second gas passage for controlling the flow of the gas supplied to the second injecting ports 110. Specially, the second mass flow controller 117 is installed on the second gas tube for controlling the flow of the gas supplied to the second gas pipe 113. The juncture place of the second gas pipe 113 and the second gas tube is sealed by a magnetic fluid for preventing the gas leak.

Please refer to FIG. 5 and FIGS. 6A to 6E showing a sequence of the substrate 107 backside cleaning by use of the substrate supporting apparatus. An end-effector 501 is used for carrying the substrate 107 above the rotatable chuck 101. The end-effector 501 has a base portion 601. The outer edge of the bottom surface of the base portion 601 protrudes downward to form a circular leaning portion 602 for preventing the substrate 107 from contacting with the bottom surface of the base portion 601 and thereby contaminating the substrate 107 when the end-effector 501 carries the substrate 107. A part of the leaning portion 602 further protrudes downward to form a stopping portion 605 for restricting the substrate 107 movement in the end-effector 501. The bottom surface of the leaning portion 602 disposes a contact sensor 604 for detecting whether the substrate 107 is put against the leaning portion 602. If the substrate 107 is put against the leaning portion 602, a pushing portion 603 is driven to push the substrate 107 to abut the stopping portion 605 and then the substrate 107 is located securely in the end-effector 501. The pushing portion 603 can be driven by a cylinder.

Figure 6A:
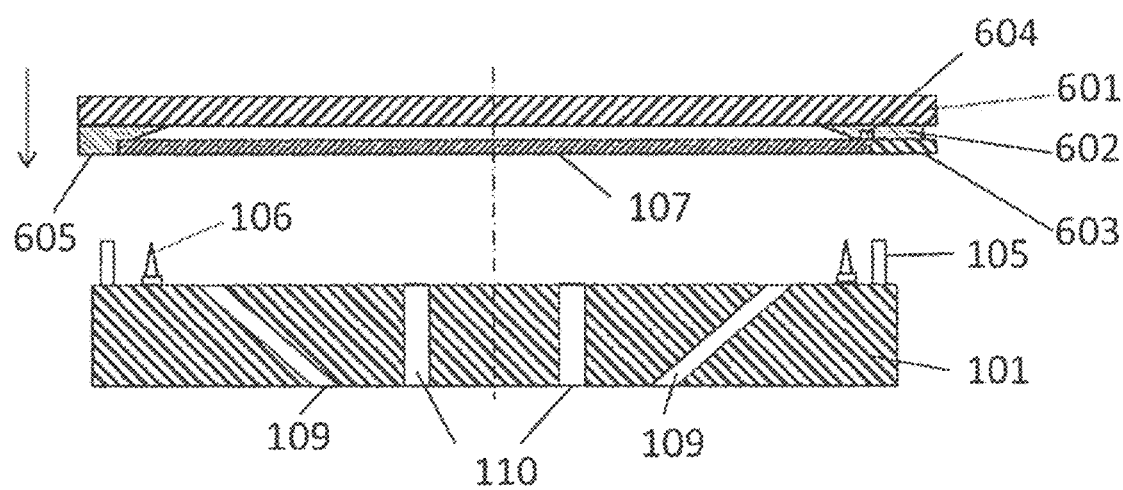
FIGS. 6A to 6E show a sequence of the end-effector putting the substrate on the substrate supporting apparatus to process.
Figure 6B:
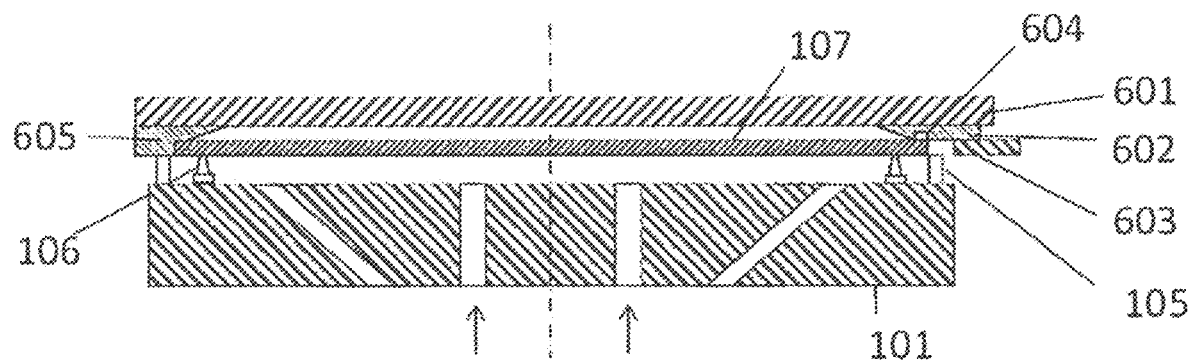
Figure 6C:
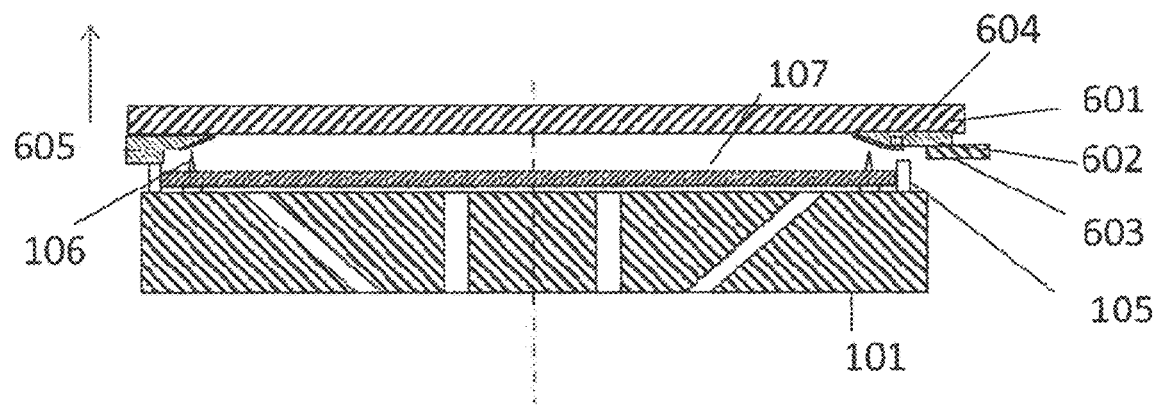
Figure 6D:
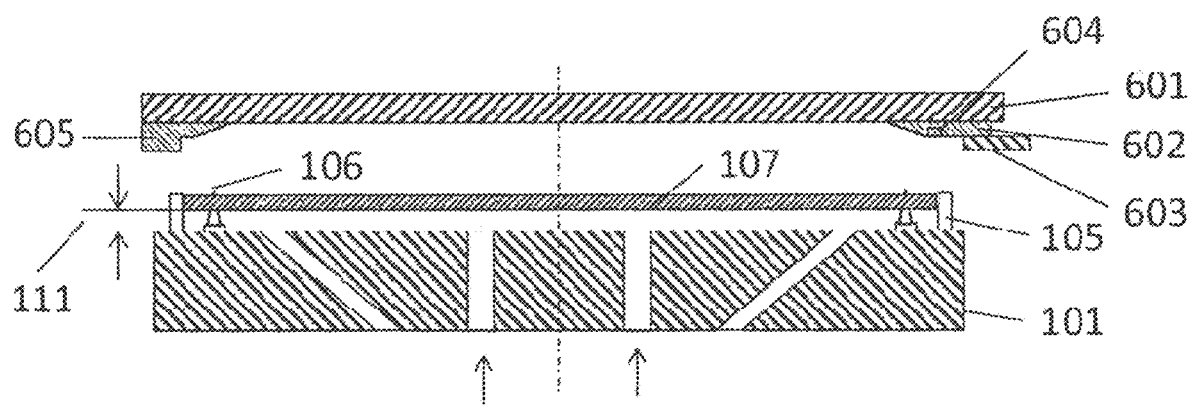
Figure 6E:
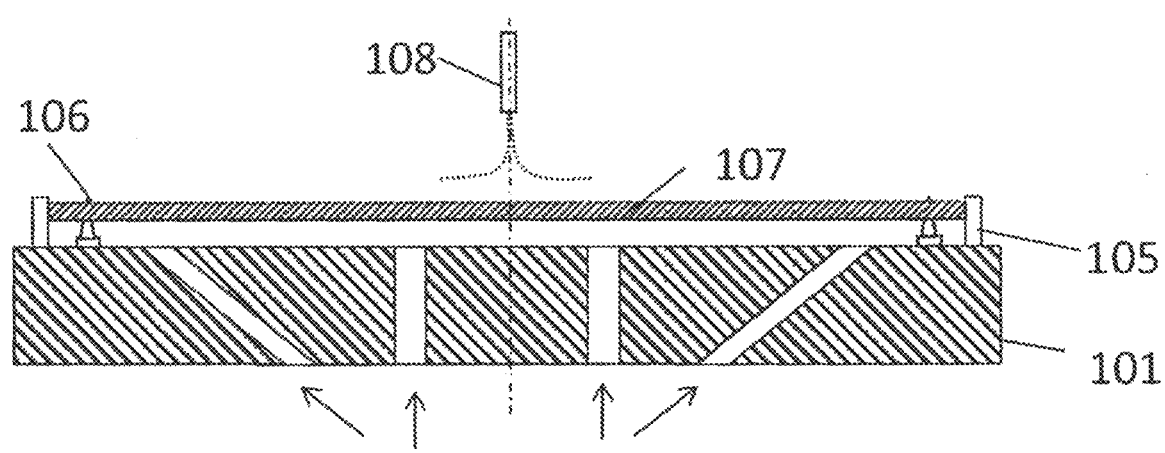

As shown in FIG. 6A, the end-effector 501 carries the substrate 107 above the rotatable chuck 101, and at this time, the first gas tube and the second gas tube are closed and it is unnecessary to supply the gas to the first injecting ports 109 and the second injecting ports 110. Then the end-effector 501 moves downward to make the substrate 107 close the guiding pillars 106. At this time, the second gas tube is opened and the gas is supplied to the front side of the substrate 107 through the second gas pipe 113 and the second injecting ports 110. For cleaning the backside of the substrate 107, the front side of the substrate 107 is arranged to face the top surface of the rotatable chuck 101. In order to avoid contaminating the front side of the substrate 107, the gas supplied to the front side of the substrate 107 is purified by the second filter 115. The gas ejected from the second injecting ports 110 lifts the substrate 107 at a predefined height and then the pushing portion 603 is pulled outwardly to release the substrate 107, as shown in FIG. 6B. Then the second gas tube is closed so the gas is stopped supplying to the substrate 107. The substrate 107 drops down to the holding portions 1061 along the side surface of the guiding pillars 106 under the action of its own gravity and is held by the holding portions 1061, which is shown in FIG. 6C. The second gas tube is opened again and the gas ejected from the second injecting ports 110 lifts the substrate 107 so that the gap 111 is formed between the front side of the substrate 107 and the top surface of the rotatable chuck 101 by adjusting the flow of the gas supplied to the second injecting ports 110 through the second mass flow controller 117, as shown in FIG. 6D. The end-effector 501 is moved away and at least one nozzle 108 is moved above the backside of the substrate 107 for spraying cleaning liquid to clean the backside of the substrate 107. When cleaning the backside of the substrate 107, the first gas tube is opened and the gas is ejected through the first injecting ports 109 for sucking the substrate 107 by Bernoulli effect. Therefore, the substrate 107 can keep in a stably floating state for backside cleaning. The first group of locating pins 105a position the substrate 107 while the motor 104 rotates the rotatable chuck 101 and the nozzle 108 sprays the cleaning liquid to clean the backside of the substrate 107. Because of the rotatable chuck 101 rotating and the gas outward ejected from the first injecting ports 109, the cleaning liquid sprayed to the backside of the substrate 107 is prevented by the flow of the gas from reaching the front side of the substrate 107. After cleaning a period of time, the second group of locating pins 105b replace the first group of locating pins 105a to position the substrate 107, by this way, the peripheral edge of the substrate 107 can be cleaned completely.

Figure 7A:
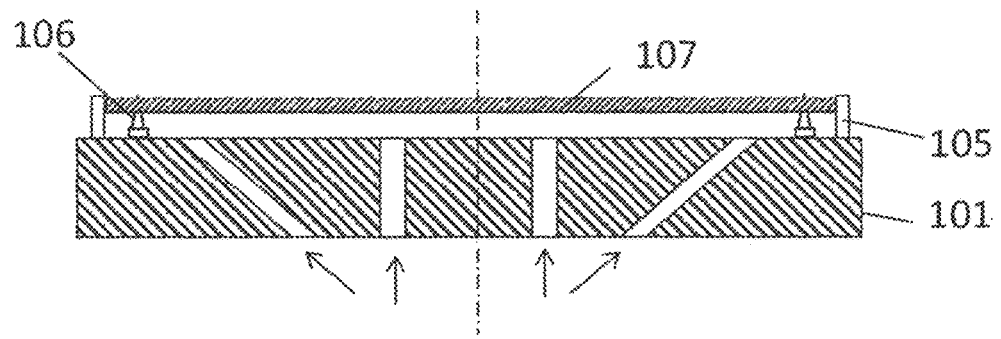
FIGS. 7A to 7F show a sequence of the end-effector getting the substrate from the substrate supporting apparatus.
Figure 7B:
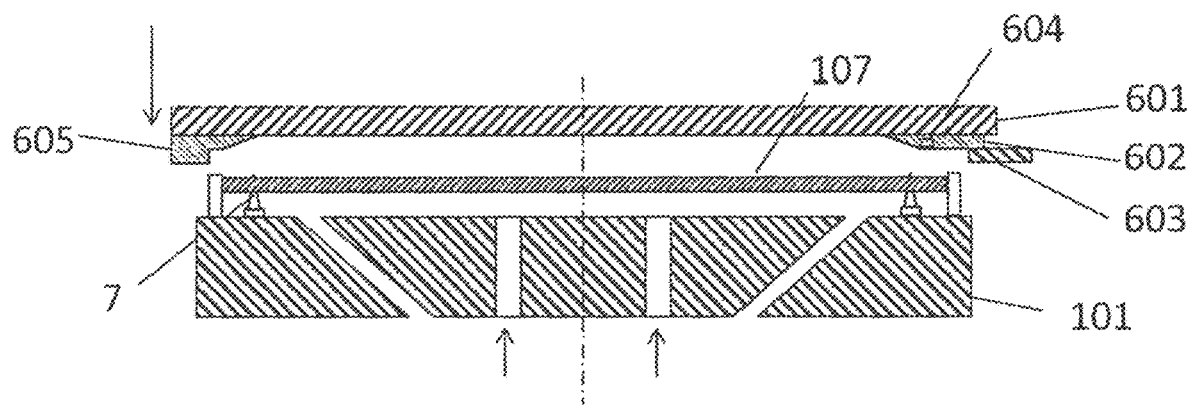
Figure 7C:
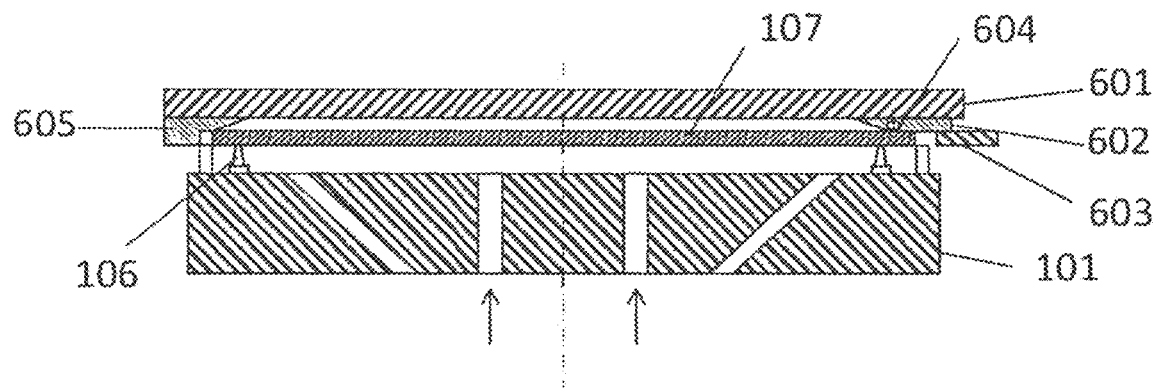
Figure 7D:
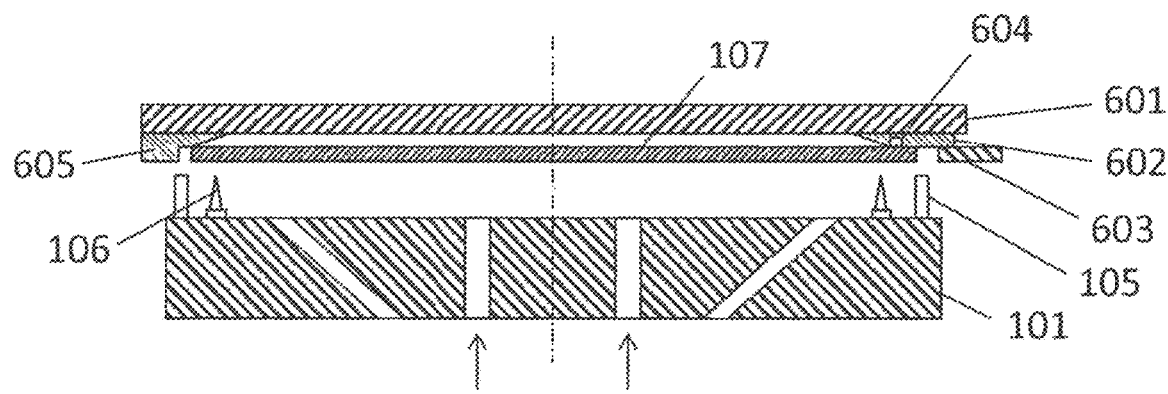
Figure 7E:
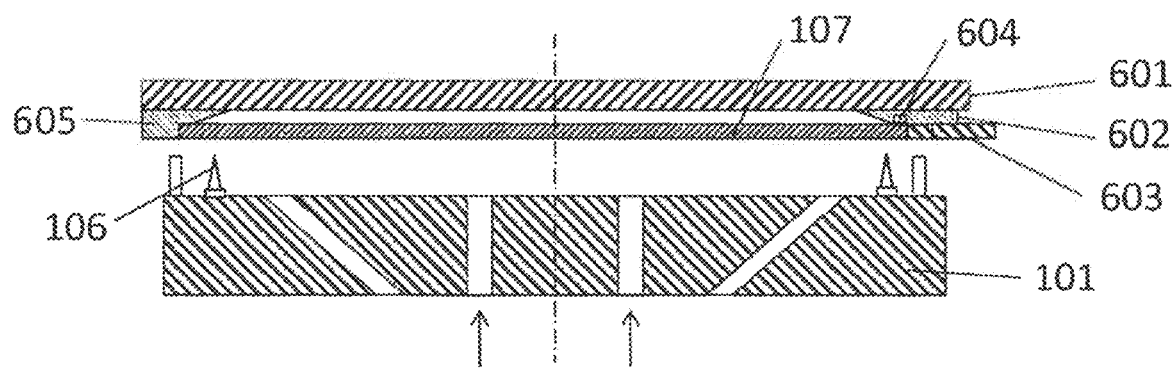
Figure 7F:
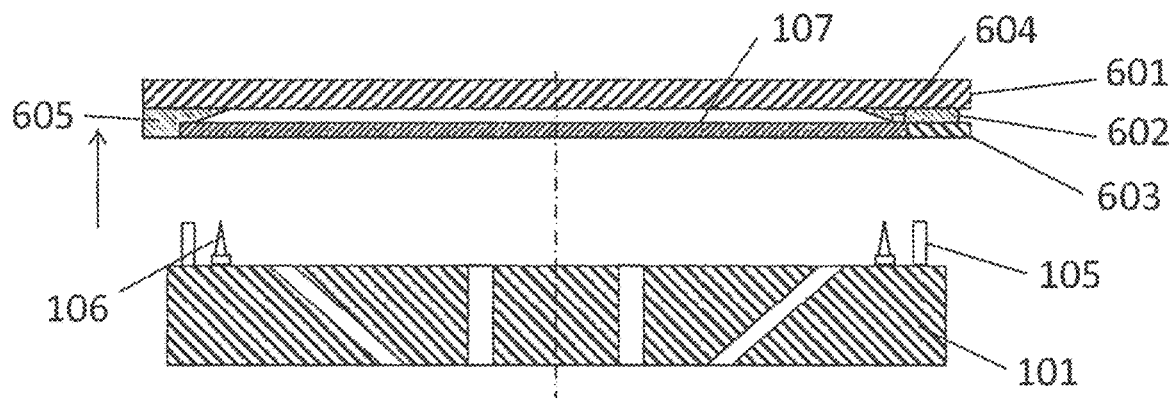

Referring to FIGS. 7A to 7F, after the backside of the substrate 107 cleaned, the nozzle 108 is moved away. The end-effector 501 is moved above the backside of the substrate 107 and the first gas tube is closed so the gas is stopped supplying to the substrate 107 through the first injecting ports 109. The second gas tube still keeps open to supply the gas to lift the substrate 107, as shown in FIG. 7B. The end-effector 501 moves downward to close the substrate 107. Then the flow of the gas supplied to the substrate 107 through the second injecting ports 110 is increased by the second mass flow controller 117 and the substrate 107 rises to reach the bottom surface of the leaning portion 602, as shown in FIG. 7C. The end-effector 501 moves upward and the substrate 107 also rises against the bottom surface of the leaning portion 602 by the gas, as shown in FIG. 7D. The contact sensor 604 detects the substrate 107 so the pushing portion 603 pushes the substrate 107 to abut the stopping portion 605 and then the substrate 107 is located securely in the end-effector 501, as shown in FIG. 7E. Finally, the second gas tube is closed and the substrate 107 is moved away by the end-effector 501, as shown in FIG. 7F.

In the above description, the gas can be inert gas such as nitrogen gas. The choice of the gas is depended on the requirements of the process. Besides, the height of the gap 111 between the lower surface of the substrate 107 and the top surface of the rotatable chuck 101 can be adjusted by controlling the flow of the gas supplied to the first injecting ports 109 and the second injecting ports 110 and the substrate 107 can keep in a stably floating state by Bernoulli principle. Furthermore, the first gas tube is only opened at the time that the cleaning liquid is supplied to clean the backside of the substrate 107, which can reduce the cost of the substrate 107 backside cleaning. It should be recognized that the substrate supporting apparatus not only suits the backside cleaning, but also suits such as etching process.

FIG. 8 to FIG. 13 illustrate a substrate supporting apparatus according to another embodiment of the present invention. The substrate supporting apparatus 200 has a rotatable chuck 201. The rotatable chuck 201 defines a plurality of first injecting ports 209 and a plurality of second injecting ports 210. A plurality of locating pins 205 are disposed at the outer edge of the top surface of the rotatable chuck 201 uniformly for preventing a substrate horizontal movement when the substrate has a predefined process such as a cleaning process. The plurality of locating pins is divided into two groups. A first group of locating pins 205a and a second group of locating pins 205b are arranged alternatively. Every locating pin is driven by an independent cylinder. The substrate supporting apparatus 200 also has a rotary spindle 203 and a hollow shaft 219. The rotary spindle 203 is set in the hollow shaft 219 and is driven to rotate by a driving device while the substrate supporting apparatus 200 supports a substrate to clean a back side of the substrate, which brings the substrate to rotate during the cleaning process. An inner wall of the hollow shaft 219 defines a first gas groove 221, a second gas groove 223, a third gas groove 225 and a forth gas groove 227. The first gas groove 221, the second gas groove 223, the third gas groove 225 and the forth gas groove 227 are ring-shaped. The hollow shaft 219 also defines a first inlet port 231 connecting to the first gas groove 221, a second inlet port 233 connecting to the second gas groove 223, a third inlet port 235 connecting to the third gas groove 225 and a forth inlet port 237 connecting to the forth gas groove 227. A first gas pipe 241 connects the first gas groove 221 and the cylinders which drive the first group of locating pins 205a. A second gas pipe 243 connects the second gas groove 223 and the cylinders which drive the second group of locating pins 205b. A third gas pipe 245 connects the third gas groove 225 and the plurality of the first injecting ports 209. A forth gas pipe 247 connects the forth gas groove 227 and the plurality of the second injecting ports 210. The first gas pipe 241, the second gas pipe 243, the third gas pipe 245 and the forth gas pipe 247 respectively rotate along with the rotary spindle 203 when the rotary spindle 203 is driven to rotate. During the substrate cleaning process, the rotary spindle 203 is rotating, but the hollow shaft 219 is non-rotating.

A plurality of guiding pillars 206 is disposed at the outer edge of the top surface of the rotatable chuck 201. The guiding pillar 206 is used for guiding the substrate to be put on the rotatable chuck 201 exactly. The bottom of the guiding pillar 206 protrudes outwardly to form a holding portion for holding the substrate when the substrate is put on the rotatable chuck 201 so a gap is formed between the lower surface of the substrate and the top surface of the rotatable chuck 201, avoiding the lower surface of the substrate contacting with the top surface of the rotatable chuck 201 thereby contaminating the lower surface of the substrate.

When using the substrate supporting apparatus 200 to support the substrate, for cleaning the back side of the substrate, a front side of the substrate is arranged to face the top surface of the rotatable chuck 201. A purified gas is supplied to the plurality of second injecting ports 210 through the forth inlet port 237, the forth gas groove 227 and the forth gas pipe 247. The purified gas ejected from the plurality of second injecting ports 210 is supplied to the front side of the substrate for lifting the substrate at a predefined height, so that the front side of the substrate doesn't contact the top surface of the substrate supporting apparatus 200, avoiding contaminating the front side of the substrate. A purified gas is supplied to the plurality of first injecting ports 209 through the third inlet port 235, the third gas groove 225 and the third gas pipe 245. The purified gas ejected from the plurality of first injecting ports 209 is supplied to the front side of the substrate for sucking the substrate by Bernoulli effect. Therefore, the substrate keeps in a stably floating state for back side cleaning. A purified gas is supplied to the cylinders which drive the first group of locating pins 205a through the first inlet port 231, the first gas groove 221 and the first gas pipe 241, so that the cylinders drive the first group of locating pins 205a to move inwardly to position the substrate or move outwardly to release the substrate. A purified gas is supplied to the cylinders which drive the second group of locating pins 205b through the second inlet port 233, the second gas groove 223 and the second gas pipe 243, so that the cylinders drive the second group of locating pins 205b to move inwardly to position the substrate or move outwardly to release the substrate. During the substrate cleaning process, the first group of locating pins 205a and the second group of locating pins 205b alternately position the substrate so that the peripheral edge of the substrate can be cleaned completely.

Figure 11:
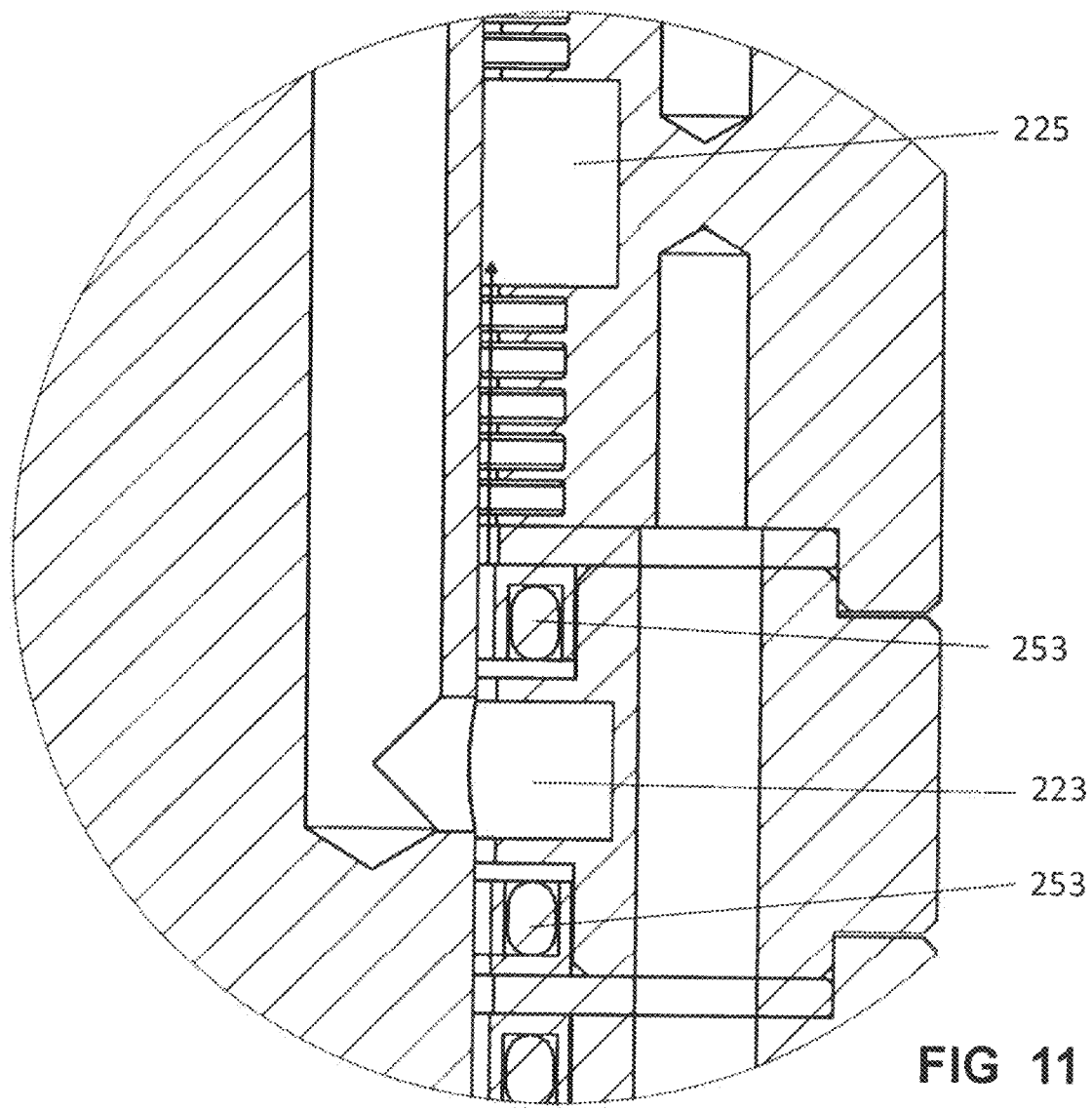
FIG. 11 is an enlarged view of F portion shown in FIG. 10.
Figure 12:
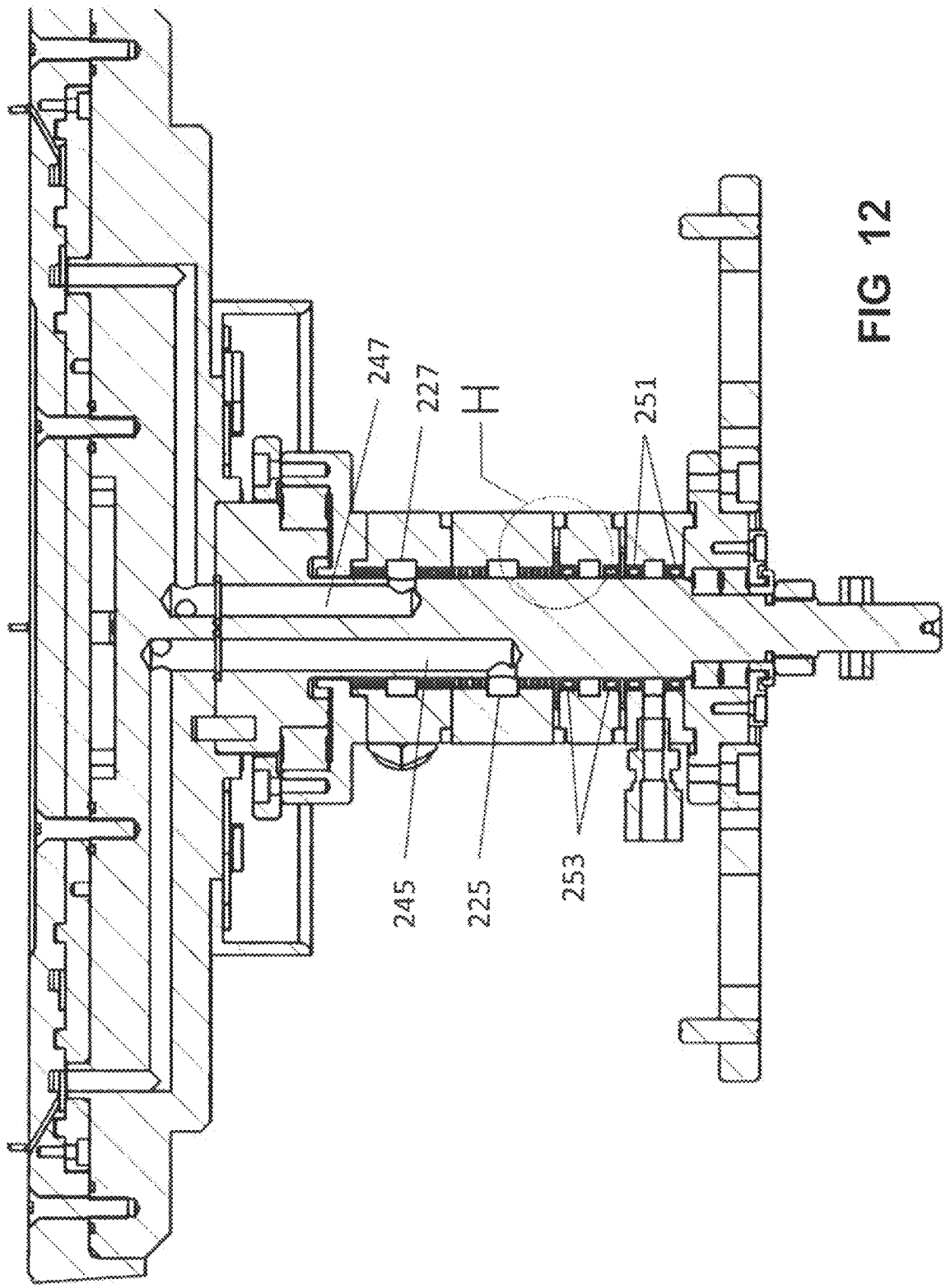
FIG. 12 is a cross-sectional view taken along line G-G in FIG. 9.
Figure 13:
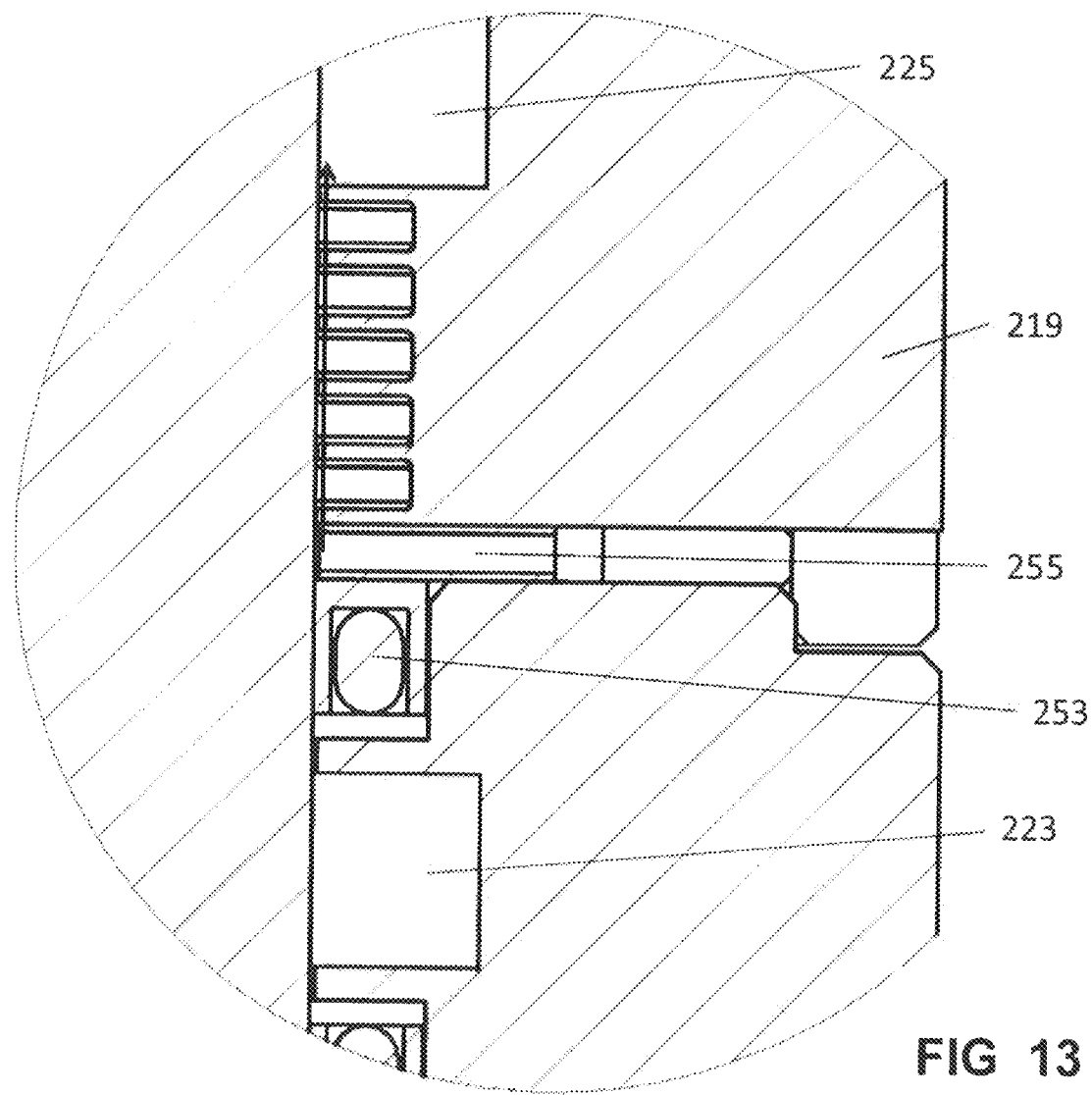
FIG. 13 is an enlarged view of H portion shown in FIG. 12.

For avoiding the friction between the rotary spindle 203 and the hollow shaft 219 to produce particles, the rotary spindle 203 and the hollow shaft 219 are not in contact and a tiny spacing is formed between the rotary spindle 203 and the hollow shaft 219. In order to insure that the pressure of the gas supplied to the cylinders is so great that can make the cylinders drive the first group of locating pins 205a and the second group of locating pins 205b, a first pair of seal rings 251 and a second pair of seal rings 253 are respectively disposed at opposite sides of the first gas groove 221 and the second gas groove 223 for preventing the gas in the first gas groove 221 and the second gas groove 223 leak from the spacing between the rotary spindle 203 and the hollow shaft 219. However, when the rotary spindle 203 rotates, particles are produced because of friction between the rotary spindle 203 and the seal rings 251, 253, and these particles, especially the particles which are produced because of the friction between the rotary spindle 203 and the seal ring 253 which is closest to the third gas groove 225 may reach the third gas groove 225 through the spacing between the rotary spindle 203 and the hollow shaft 219, and further reach the front side of the substrate through the third gas pipe 245. Although the hollow shaft 219 defines an exhaust port 255 to exhaust the gas and release the gas pressure in the spacing between the rotary spindle 203 and the hollow shaft 219, part particles are exhausted along with the gas, but the kinetic energy of the gas makes the particles move upward in the spacing, so there still some particles reach the third gas groove 225 and further reach the front side of the substrate during the substrate back side cleaning process. The move path of the particle in the spacing is shown in FIG. 11 and FIG. 13, which is shown by the arrow. Therefore, it needs to find a solution to solve the problem and improve the quality of the semiconductor device.

Please refer to FIG. 14 to FIG. 21, showing a substrate supporting apparatus according to another embodiment of the present invention. The substrate supporting apparatus 300 has a rotatable chuck 301, a rotary spindle 303 and a hollow shaft 319. The rotatable chuck 301 is used for supporting a substrate. The rotary spindle 303 is set in the hollow shaft 319. The rotary spindle 303 connects to the rotatable chuck 301 and brings the rotatable chuck 301 to rotate while the rotary spindle 303 is driven to rotate in the hollow shaft 319 by a driving device. When the substrate supporting apparatus 300 is used for supporting the substrate for cleaning a back side of the substrate, the rotary spindle 303 rotates in the hollow shaft 319, but the hollow shaft 319 keeps non-rotating.

Figure 15:
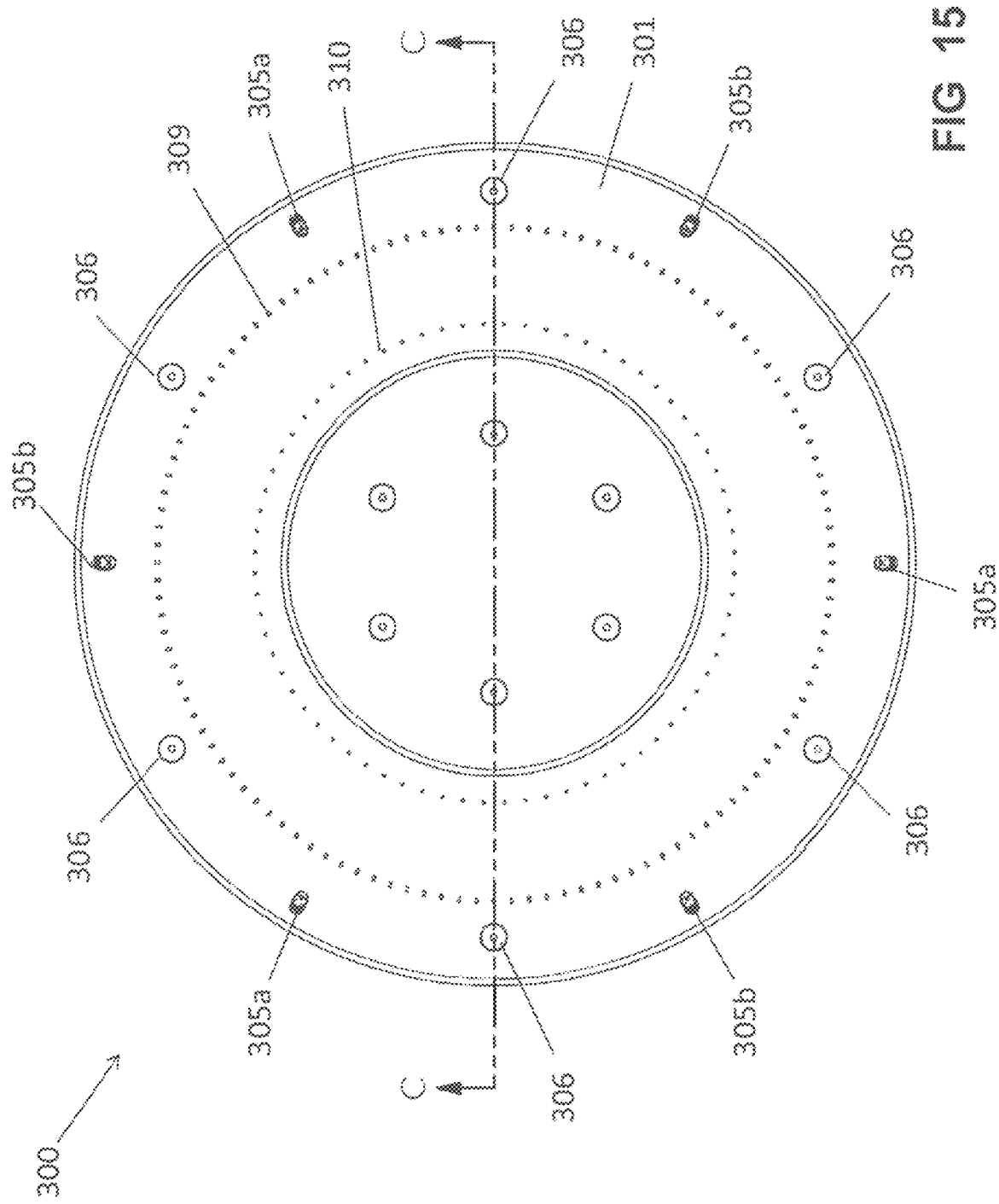
FIG. 15 is a top view of the substrate supporting apparatus shown in FIG. 14.
Figure 16:
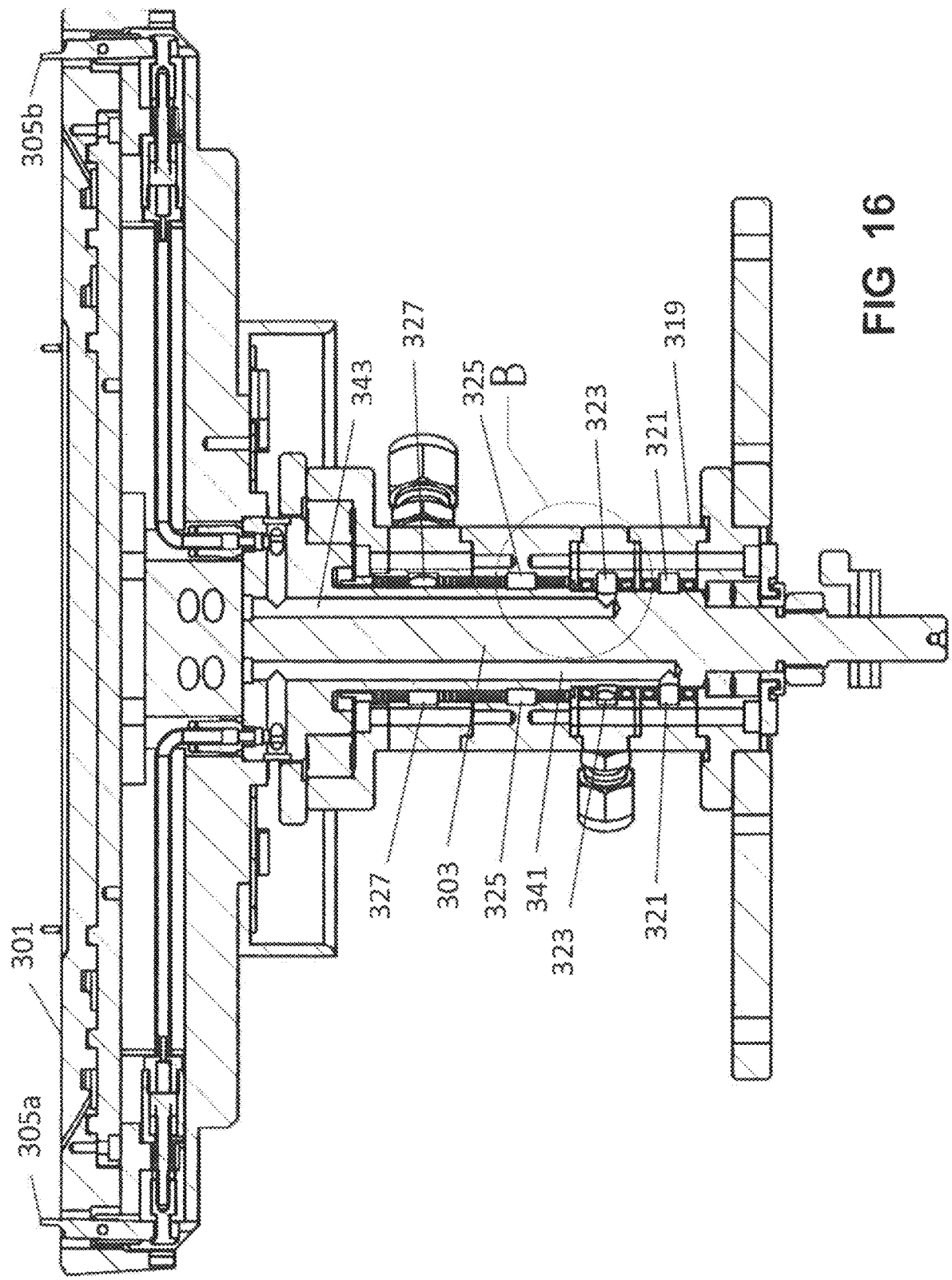
FIG. 16 is a cross-sectional view taken along line A-A in FIG. 14.
Figure 17:
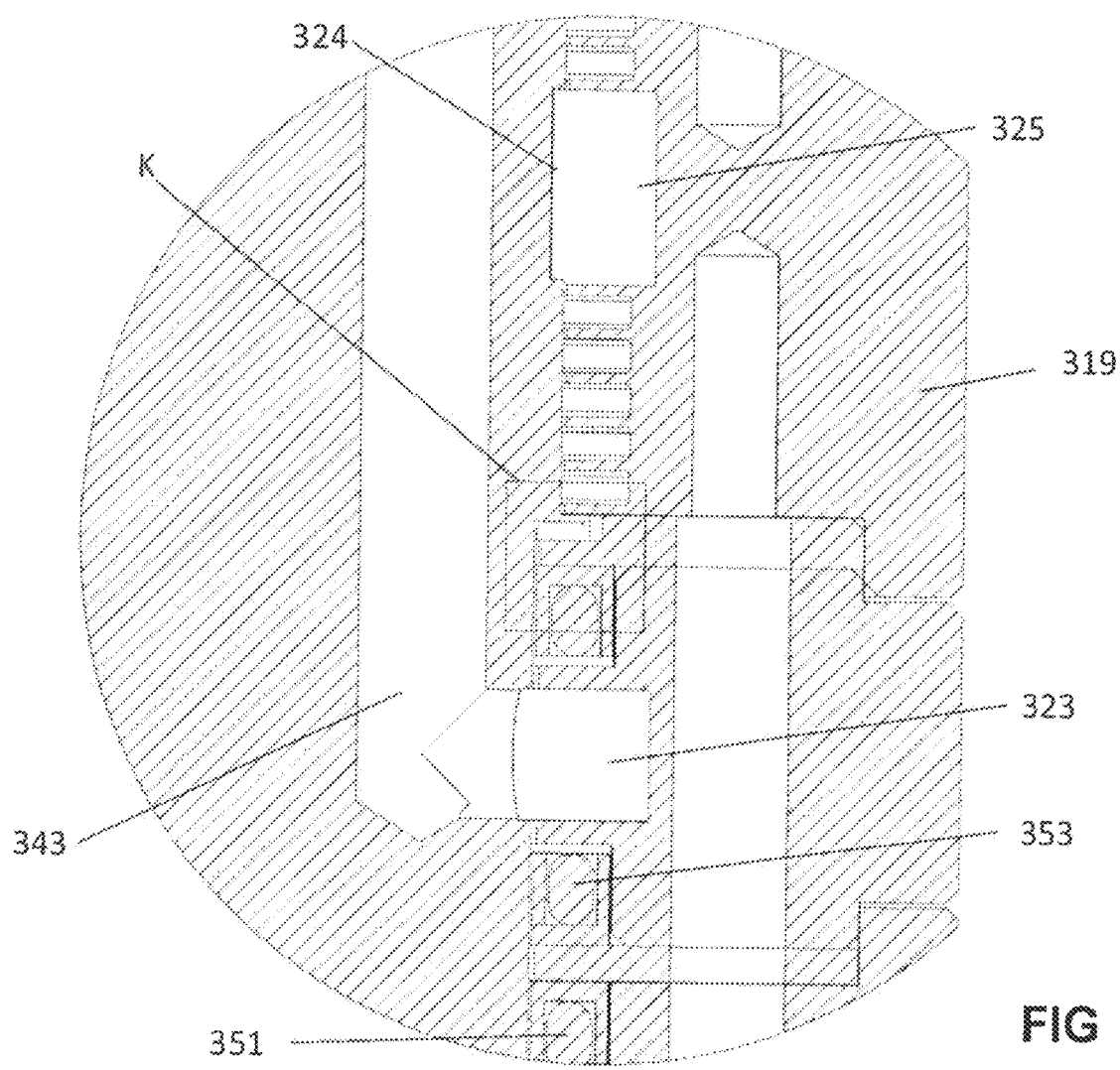
FIG. 17 is an enlarged view of B portion shown in FIG. 16.

As shown in FIG. 15, the rotatable chuck 301 has a plurality of first injecting ports 309 and a plurality of second injecting ports 310. A plurality of locating pins 305 and a plurality of guiding pillars 306 are disposed at the outer edge of the top surface of the rotatable chuck 301. The plurality of locating pins 305 are divided into two groups. A first group of locating pins 305a and a second group of locating pins 305b are arranged alternatively for preventing the substrate horizontal movement. Every locating pin 305 is driven to move inwardly to position the substrate or move outwardly to release the substrate by an independent cylinder. During the substrate cleaning process, the two groups of locating pins 305a, 305b alternately position the substrate so that the peripheral edge of the substrate can be cleaned completely. Every guiding pillar 306 is set between every adjacent two locating pins. Every guiding pillar 306 has a guiding surface for guiding the substrate to be put on the rotatable chuck 301 exactly and a holding portion for holding the substrate when the substrate is put on the rotatable chuck 301 so a gap is formed between the lower surface of the substrate and the top surface of the rotatable chuck 301, avoiding the lower surface of the substrate contacting the top surface of the rotatable chuck 301 thereby contaminating the lower surface of the substrate. If the substrate supporting apparatus 300 is used for cleaning the back side of the substrate, the lower surface of the substrate is the front side of the substrate.

An inner wall of the hollow shaft 319 defines a first gas groove 321, a second gas groove 323, a third gas groove 325 and a forth gas groove 327. The first gas groove 321, the second gas groove 323, the third gas groove 325 and the forth gas groove 327 are ring-shaped. The hollow shaft 319 also defines a first inlet port 331 connecting to the first gas groove 321, a second inlet port 333 connecting to the second gas groove 323, a third inlet port 335 connecting to the third gas groove 325 and a forth inlet port 337 connecting to the forth gas groove 327. A first gas pipe 341 connects to the first gas groove 321 for supplying gas to the cylinders which drive the first group of locating pins 305a. A second gas pipe 343 connects to the second gas groove 323 for supplying gas to the cylinders which drive the second group of locating pins 305b. A third gas pipe 345 connects to the third gas groove 325 for supplying gas to the plurality of the first injecting ports 309. A forth gas pipe 347 connects to the forth gas groove 327 for supplying gas to the plurality of the second injecting ports 310. The first gas pipe 341, the second gas pipe 343, the third gas pipe 345 and the forth gas pipe 347 respectively rotate along with the rotary spindle 303 when the rotary spindle 303 is driven to rotate.

When using the substrate supporting apparatus 300 to support the substrate for cleaning the back side of the substrate, the front side of the substrate is arranged to face the top surface of the rotatable chuck 301. A purified gas is supplied to the plurality of second injecting ports 310 through the forth inlet port 337, the forth gas groove 327 and the forth gas pipe 347. The purified gas ejected from the plurality of second injecting ports 310 is supplied to the front side of the substrate for lifting the substrate at a predefined height, so that the front side of the substrate doesn't contact the top surface of the rotatable chuck 301, avoiding contaminating the front side of the substrate. A purified gas is supplied to the plurality of first injecting ports 309 through the third inlet port 335, the third gas groove 325 and the third gas pipe 345. The purified gas ejected from the plurality of first injecting ports 309 is supplied to the front side of the substrate for sucking the substrate by Bernoulli effect. Therefore, the substrate keeps in a stably floating state for back side cleaning. A purified gas is supplied to the cylinders which drive the first group of locating pins 305a through the first inlet port 331, the first gas groove 321 and the first gas pipe 341, so that the cylinders drive the first group of locating pins 305a to move inwardly to position the substrate or move outwardly to release the substrate. A purified gas is supplied to the cylinders which drive the second group of locating pins 305b through the second inlet port 333, the second gas groove 323 and the second gas pipe 343, so that the cylinders drive the second group of locating pins 305b to move inwardly to position the substrate or move outwardly to release the substrate. During the substrate back side cleaning process, the first group of locating pins 305a and the second group of locating pins 305b alternately position the substrate so that the peripheral edge of the substrate can be cleaned completely.

There is a tiny spacing formed between an outer wall of the rotary spindle 303 and the inner wall of the hollow shaft 319 for avoiding the friction between the rotary spindle 303 and the hollow shaft 319 to produce particles. In order to insure that the pressure of the gas supplied to the cylinders can make the cylinders drive the first group of locating pins 305a and the second group of locating pins 305b, a first pair of seal rings 351 and a second pair of seal rings 353 are respectively disposed at opposite sides of the first gas groove 321 and the second gas groove 323 for preventing the gas in the first gas groove 321 and the second gas groove 323 leak from the spacing between the rotary spindle 303 and the hollow shaft 319. The hollow shaft 319 defines an exhaust port 355 adjacent to the seal ring 353 which is closest to the third gas groove 325.

Figure 18:
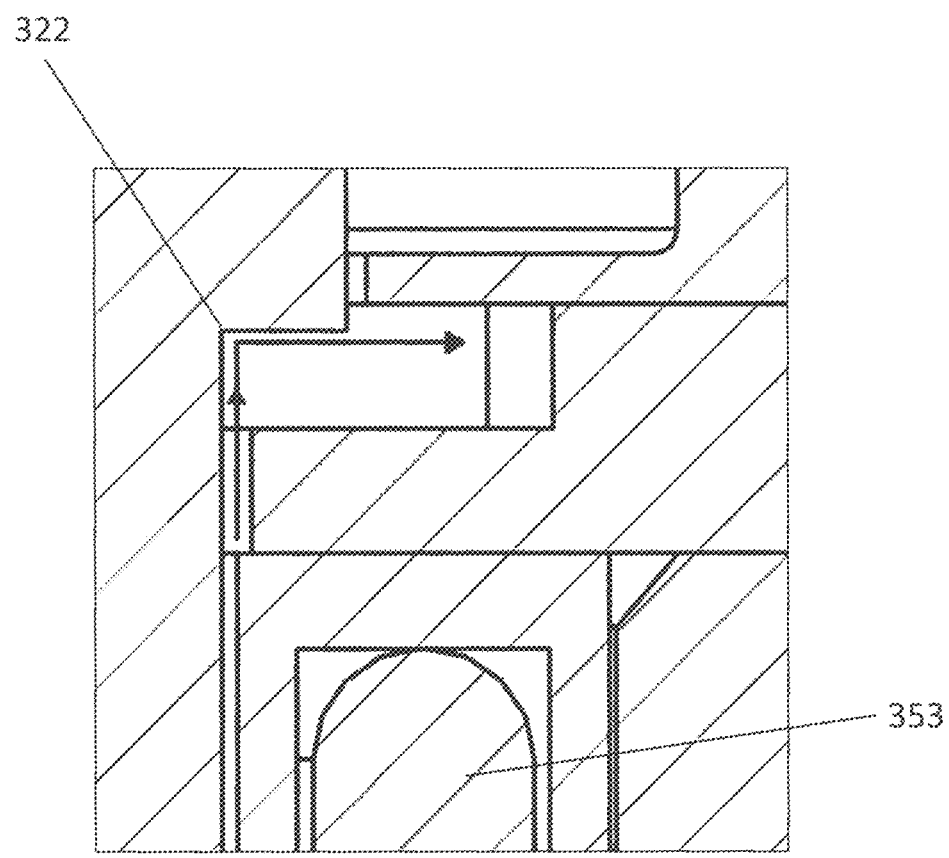
FIG. 18 is an enlarged view of K portion shown in FIG. 17.
Figure 19:
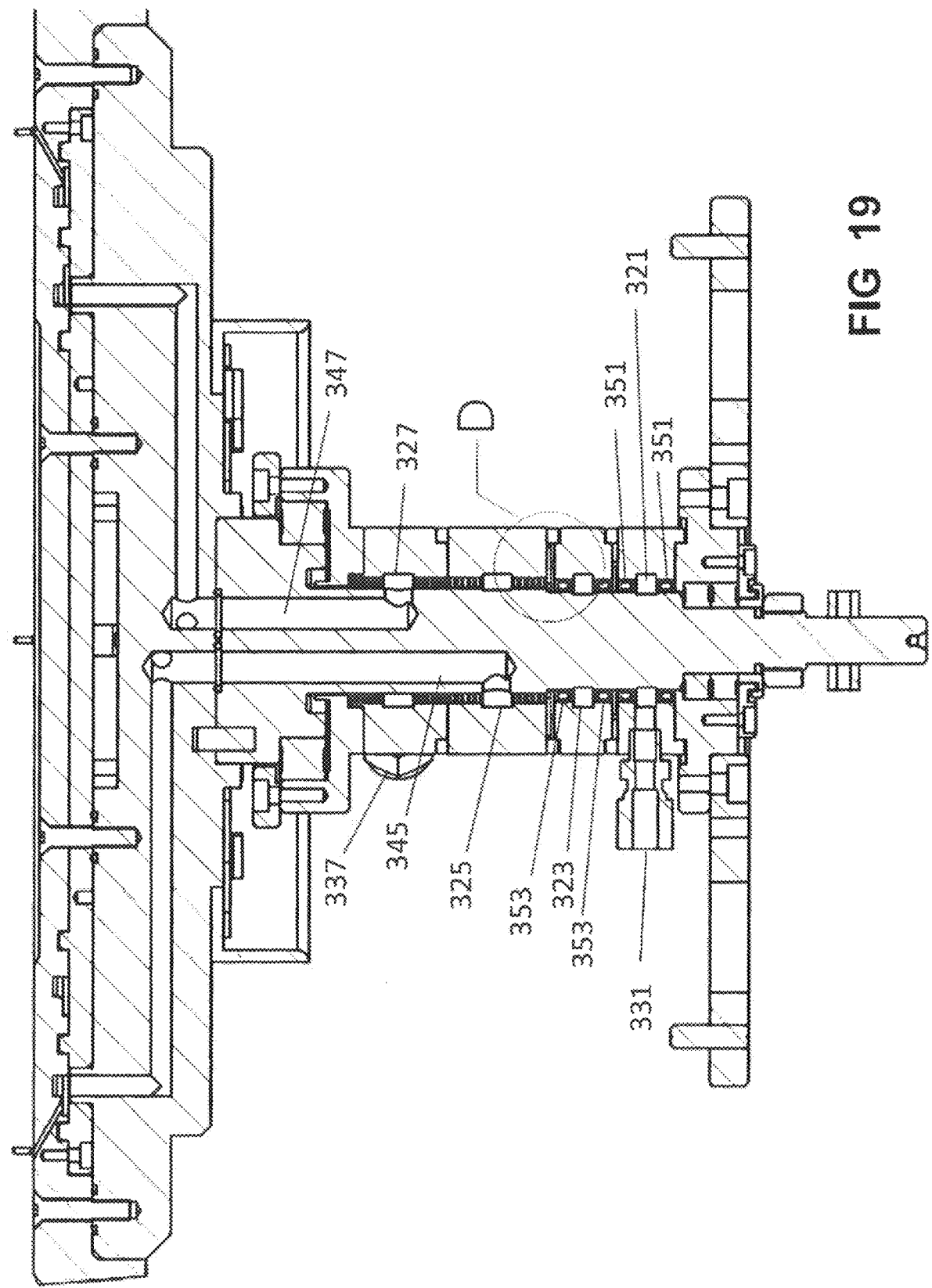
FIG. 19 is a cross-sectional view taken along line C-C in FIG. 15.
Figure 20:
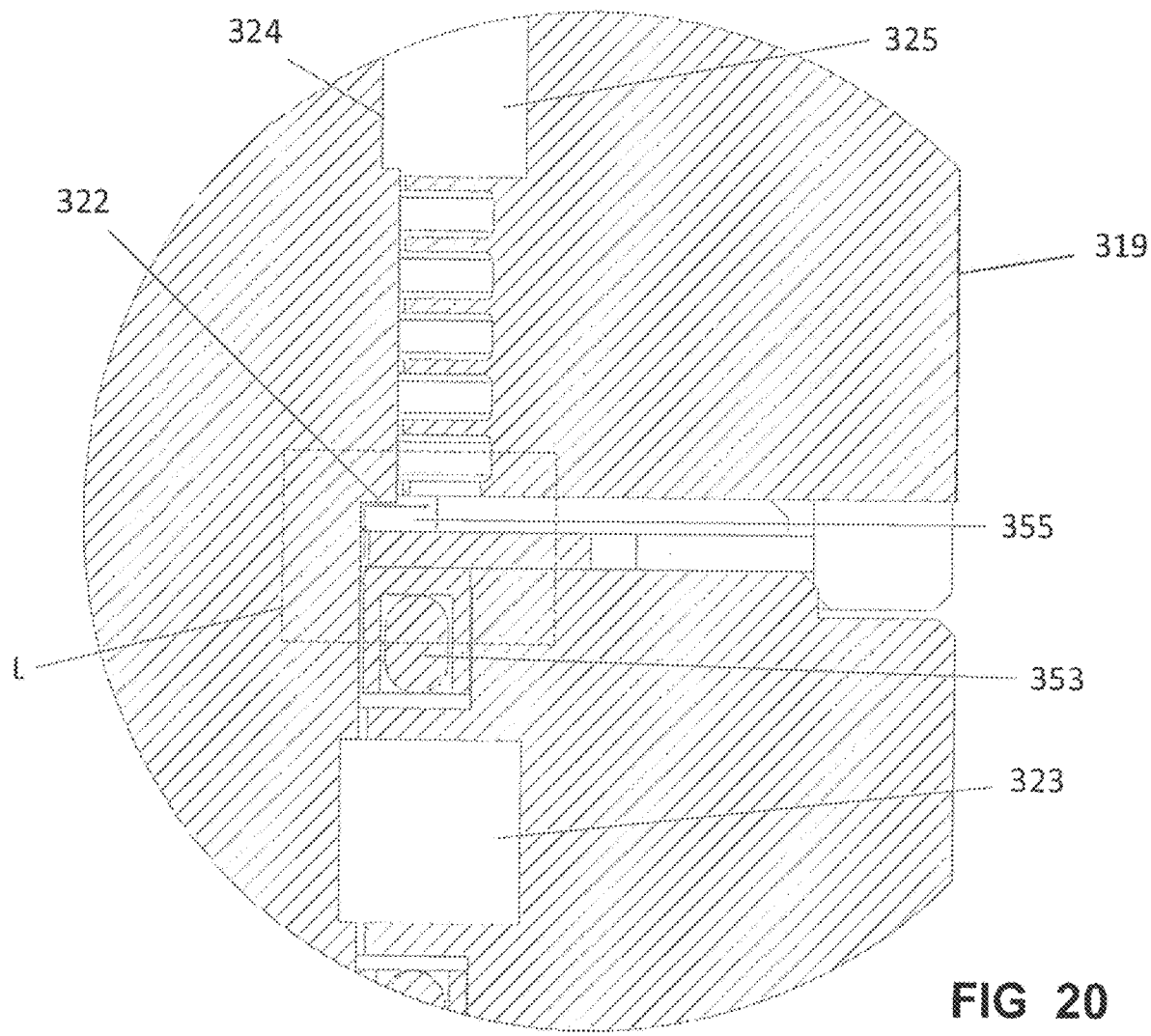
FIG. 20 is an enlarged view of D portion shown in FIG. 19.
Figure 21:
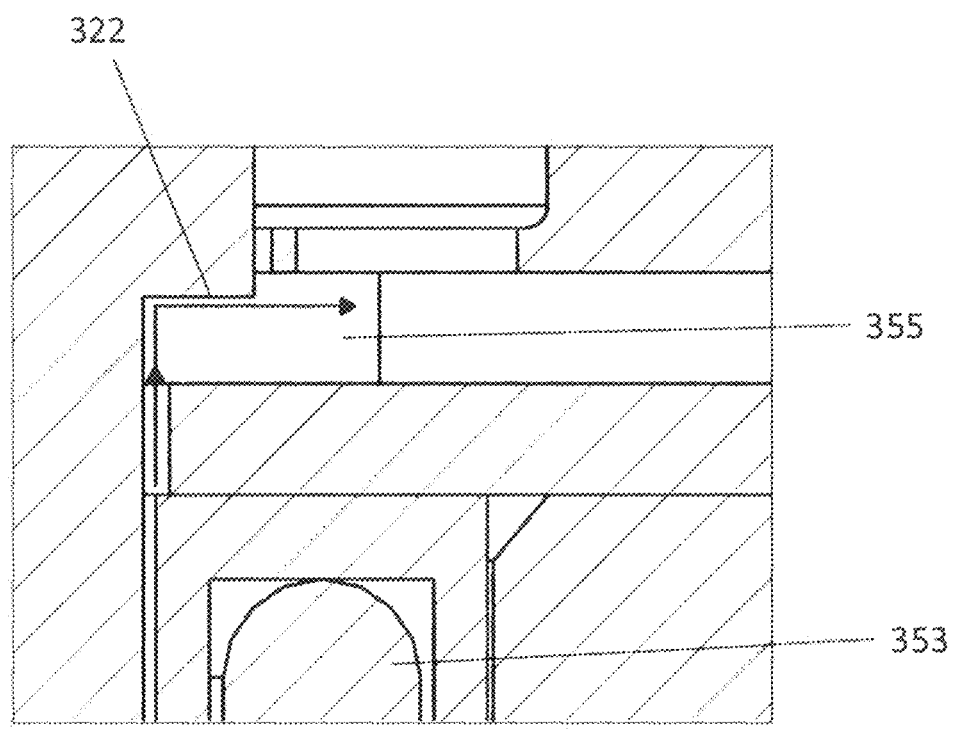
FIG. 21 is an enlarged view of L portion shown in FIG. 20.

For preventing the particles produced because of friction between the rotary spindle 303 and the seal rings 351, 353 from reaching the third gas groove 325 and further reaching the front side of the substrate through the third gas pipe 345, the outer wall of the rotary spindle 303 defines a blocking wall 322 corresponding to the exhaust port 355. The outer wall of the rotary spindle 303 also defines a ring-shaped recess 324 matching the third gas groove 325. The third gas pipe 345 connects to the recess 324 for supplying purified gas to the plurality of the first injecting ports 309. During cleaning the back side of the substrate, the particles produced because of the friction between the rotary spindle 303 and the seal ring 353 which is closest to the third gas groove 325 move upward with the gas in the spacing between the rotary spindle 303 and the hollow shaft 319, and is blocked by the blocking wall 322. In an embodiment, the blocking wall 322 is in right angle. The particles move upward and then move toward the exhaust port 355 when the particles are blocked by the blocking wall 322. The move path of the particles is shown in FIG. 18 and FIG. 21, which is shown by the arrow. At the same time, the gas in the spacing between the rotary spindle 303 and the hollow shaft 319 is exhausted through the exhaust port 355. Therefore, the particles are exhausted with the gas. Besides, the purified gas with a certain pressure is supplied to the recess 324, and the gas pressure prevents the gas in the spacing from entering the third gas groove 325, combining exhausting gas through the exhaust port 355, which prevents the particles from reaching the third gas groove 325 and contaminating the front side of the substrate. Due to good seal effect of the seal rings 351, 353, generally, the particles produced because of friction between the rotary spindle 303 and the seal rings 351 and the other seal ring 353 cannot reach the third gas groove 325.

Figure 22A:
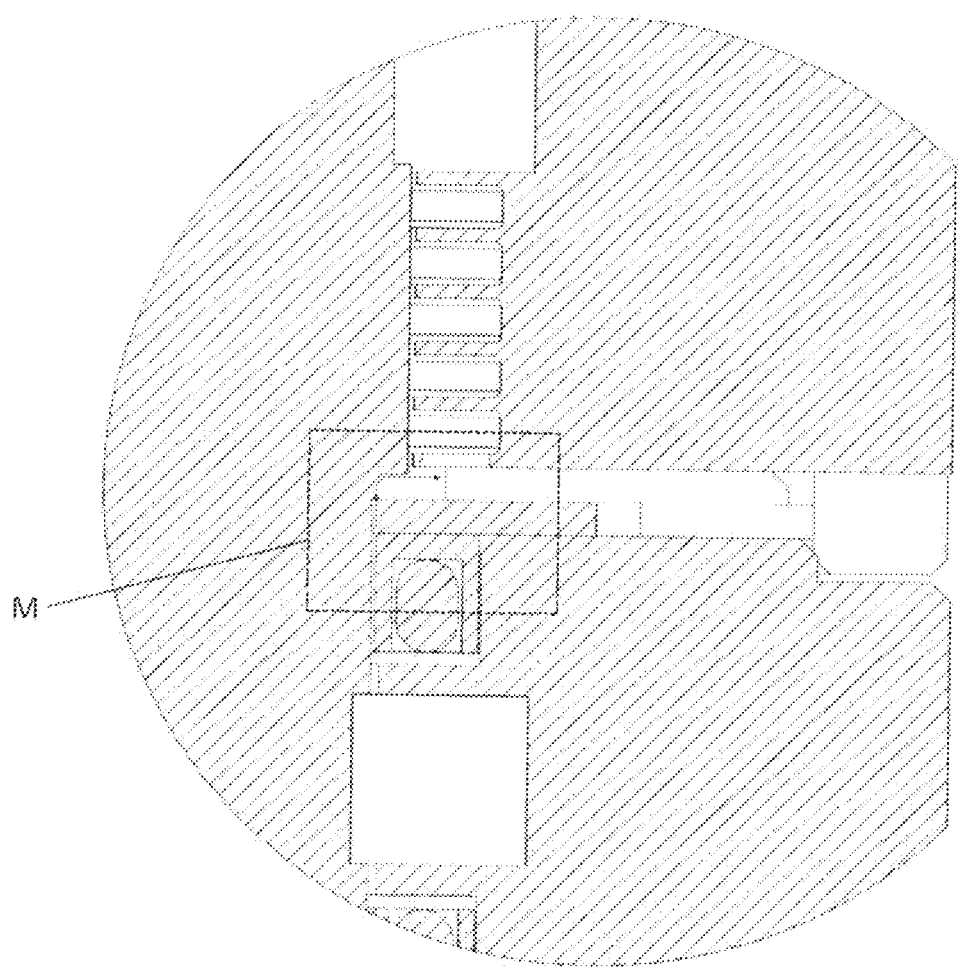
FIG. 22A shows another exemplary blocking wall according to the present invention.
Figure 22B:
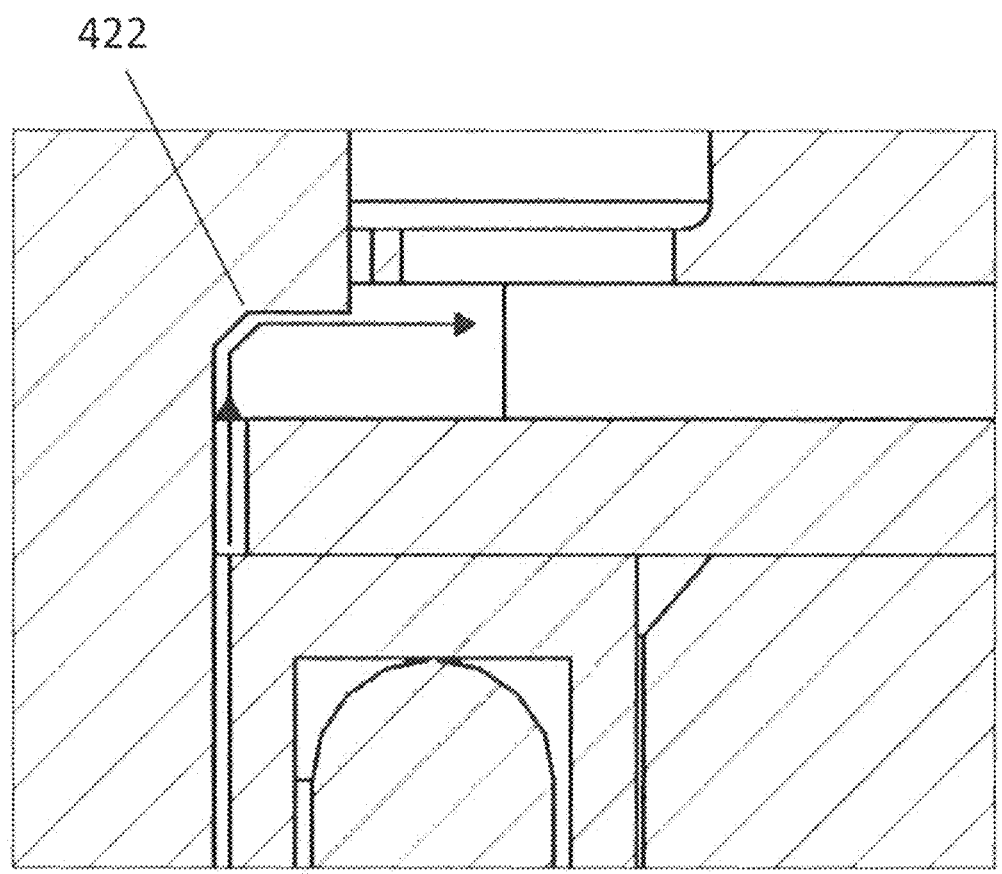
FIG. 22B is an enlarged view of M portion shown in FIG. 22A.

Referring to FIGS. 22A and 22B, in another embodiment of the present invention, the blocking wall 422 is in polygon, and the move path of the particles is shown in FIG. 22B, which is shown by the arrow.

Figure 23A:
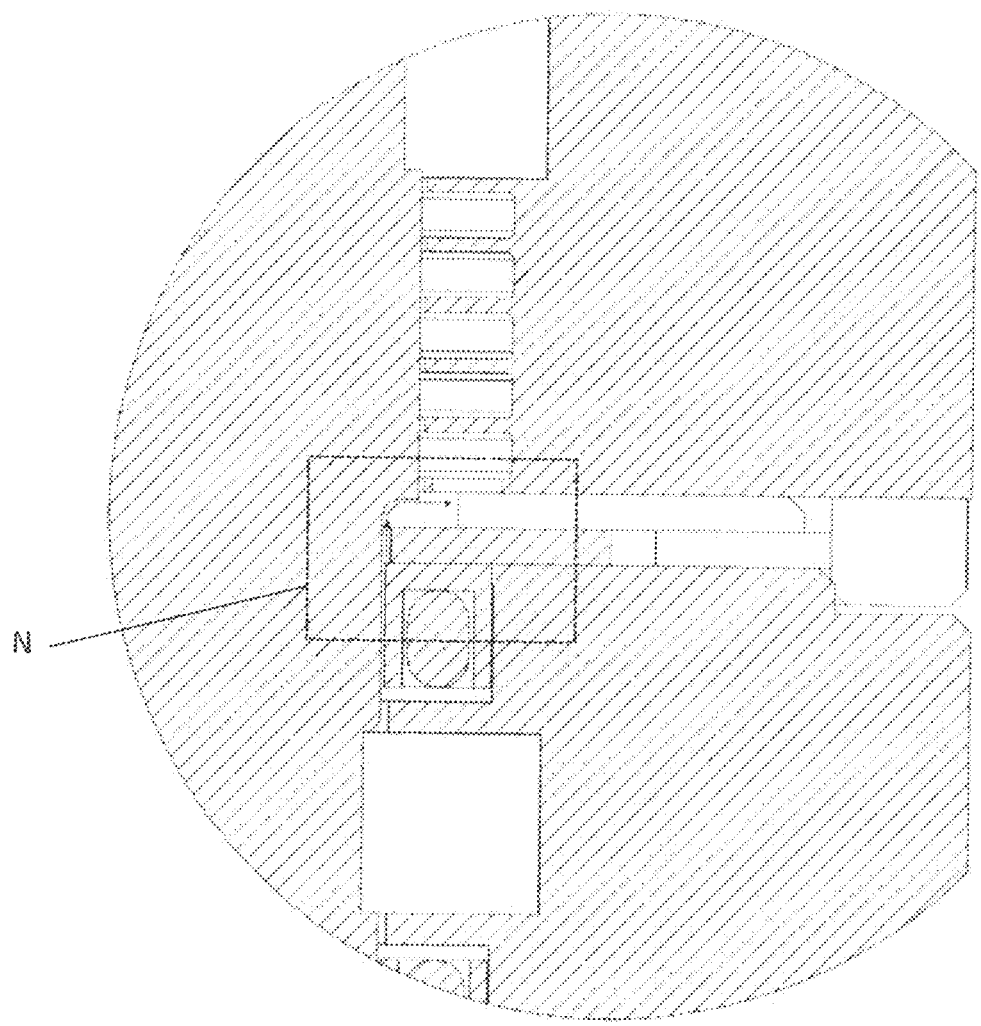
FIG. 23A shows another exemplary blocking wall according to the present invention.
Figure 23B:
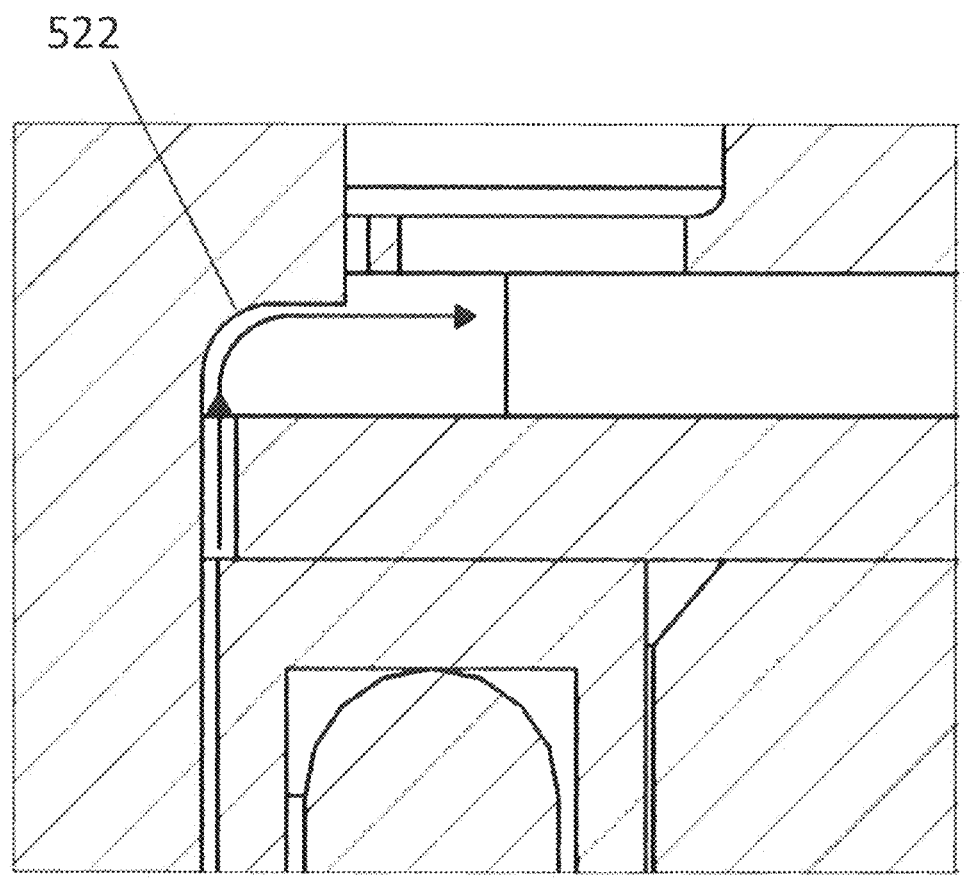
FIG. 23B is an enlarged view of N portion shown in FIG. 23A.

Referring to FIGS. 23A and 23B, in another embodiment of the present invention, the blocking wall 522 is in arc, and the move path of the particles is shown in FIG. 23B, which is shown by the arrow.

Figure 8:
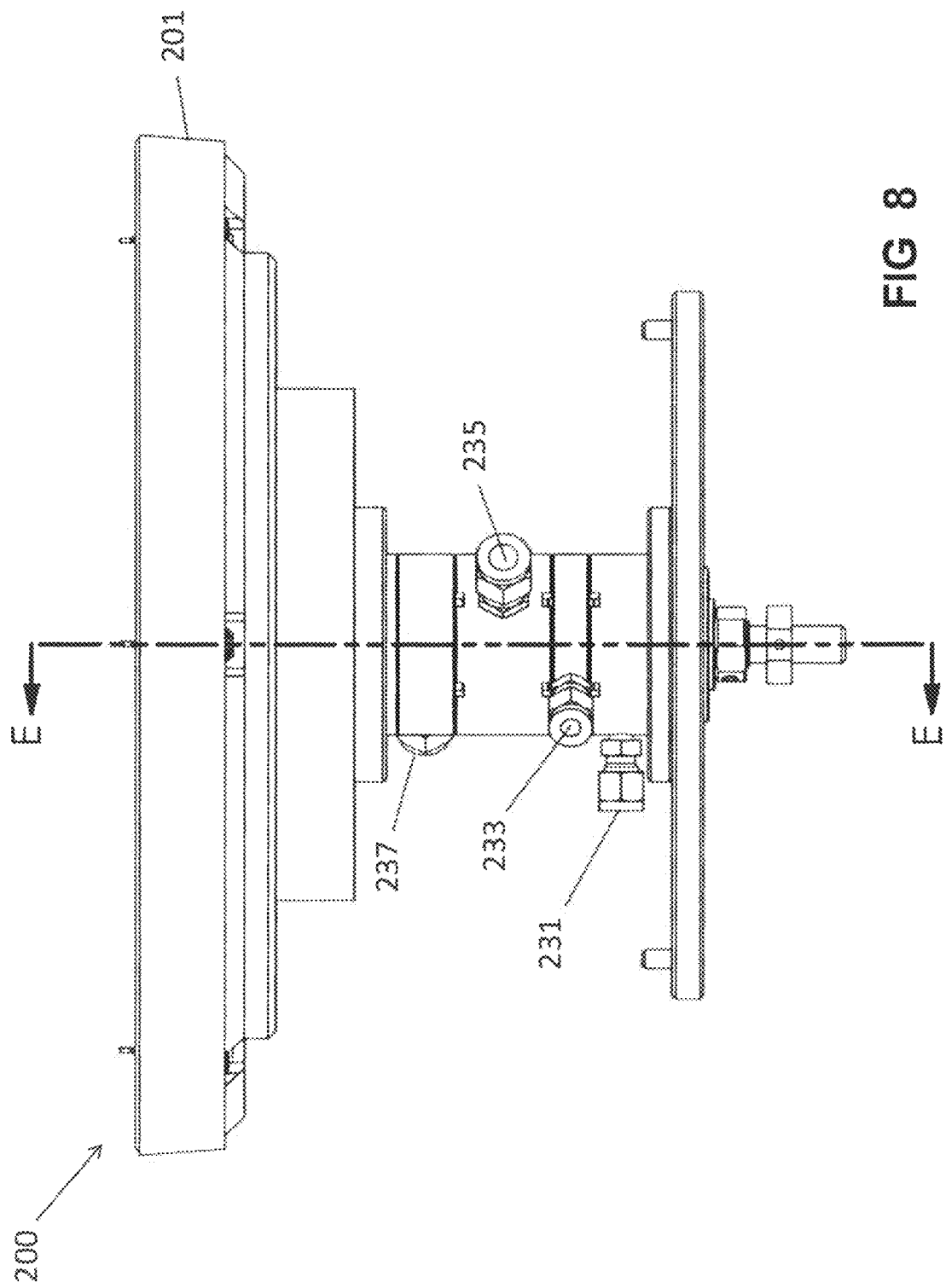
FIG. 8 is a front view of an exemplary substrate supporting apparatus according to another embodiment of the present invention.
Figure 9:
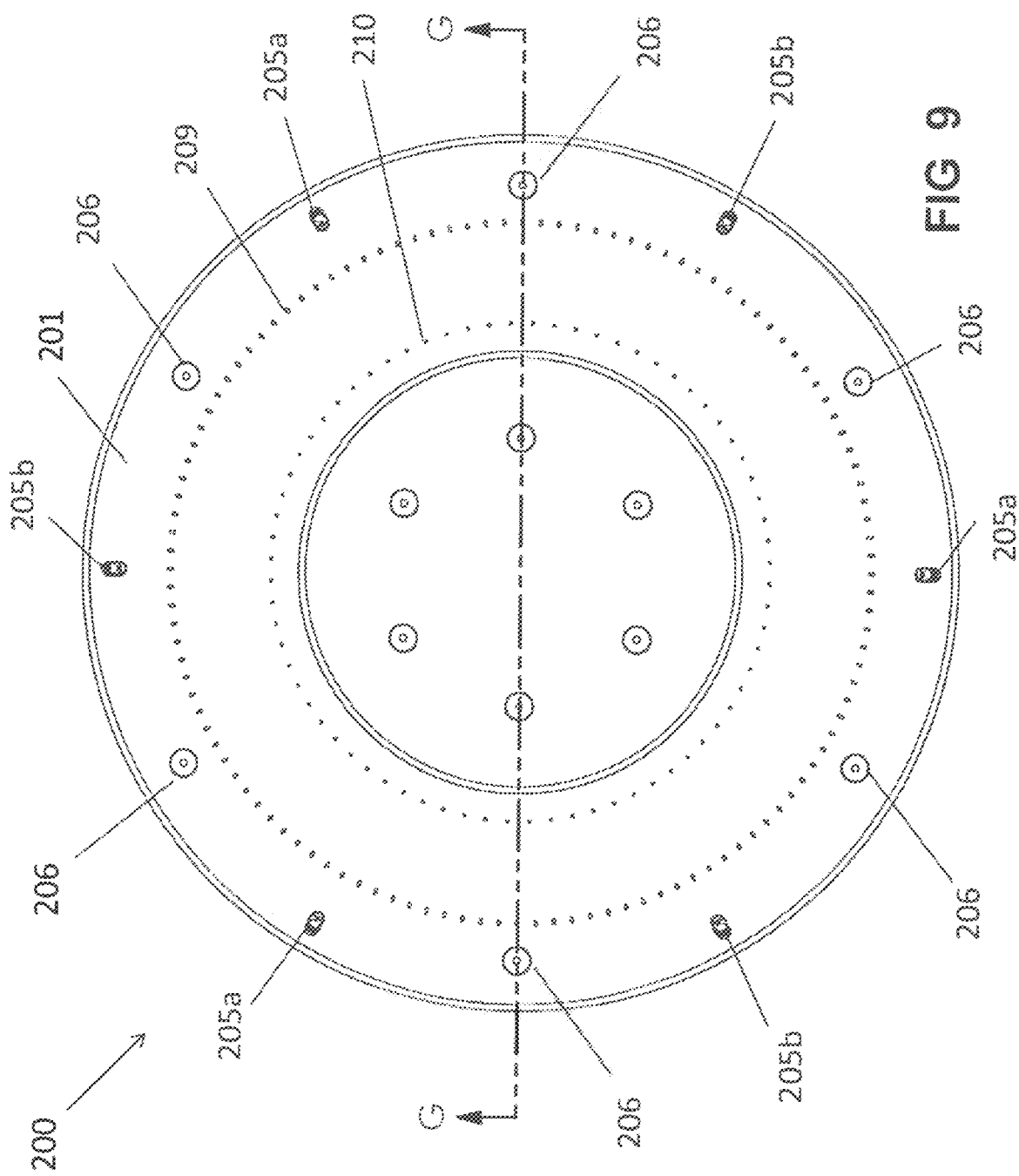
FIG. 9 is a top view of the substrate supporting apparatus shown in FIG. 8.
Figure 10:
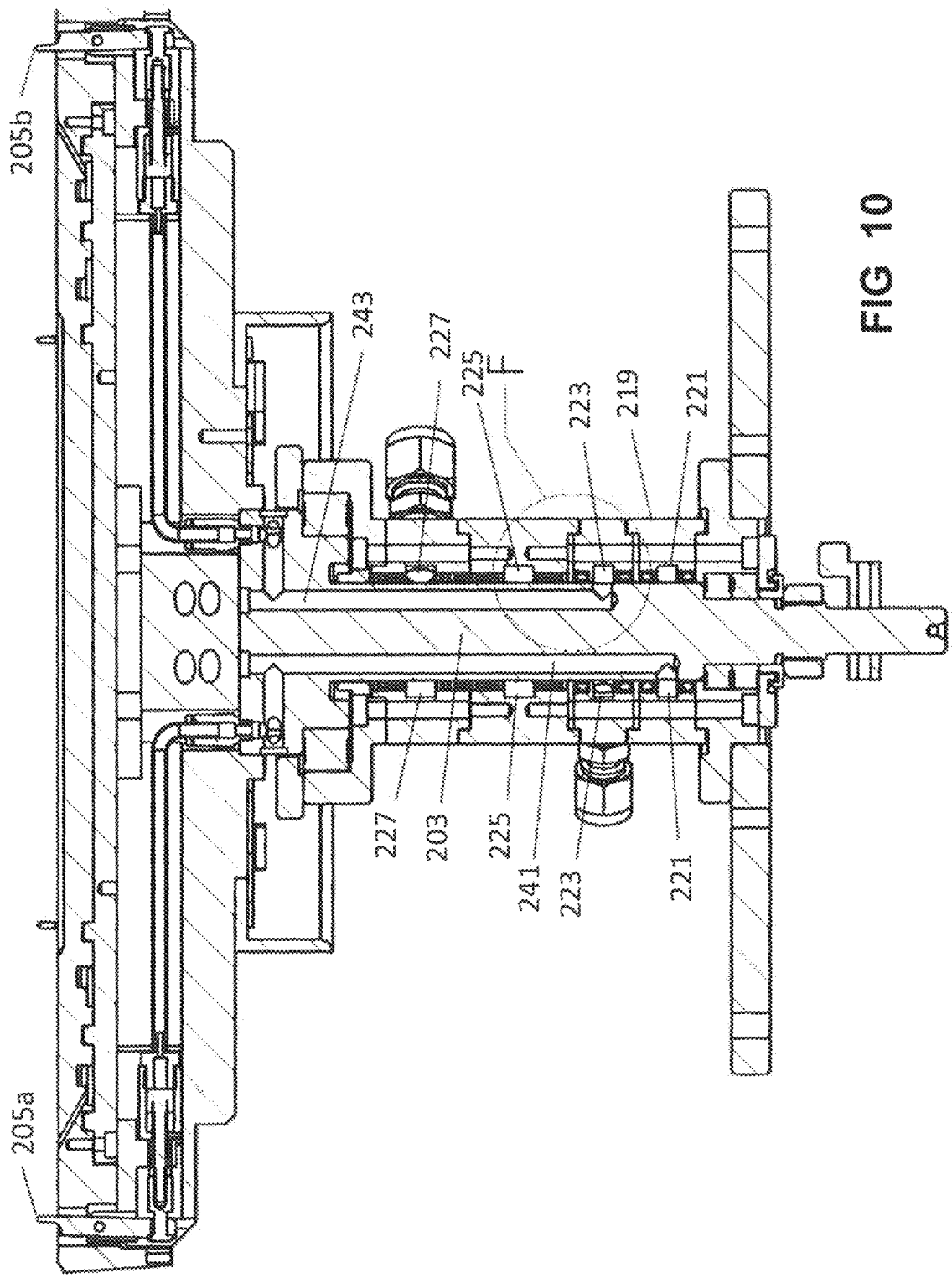
FIG. 10 is a cross-sectional view taken along line E-E in FIG. 8.
Figure 14:
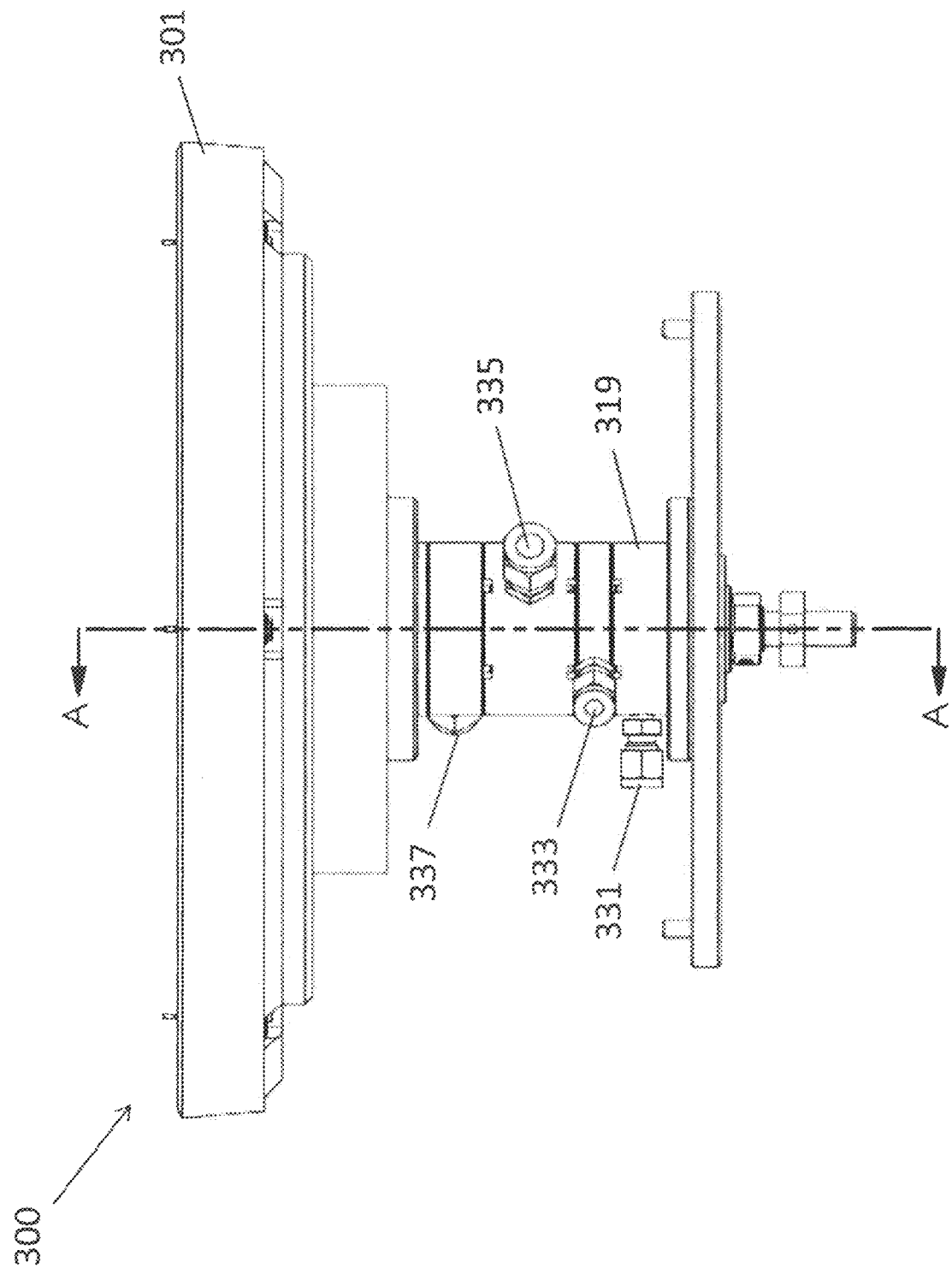
FIG. 14 is a front view of an exemplary substrate supporting apparatus according to another embodiment of the present invention.
Figure 24:
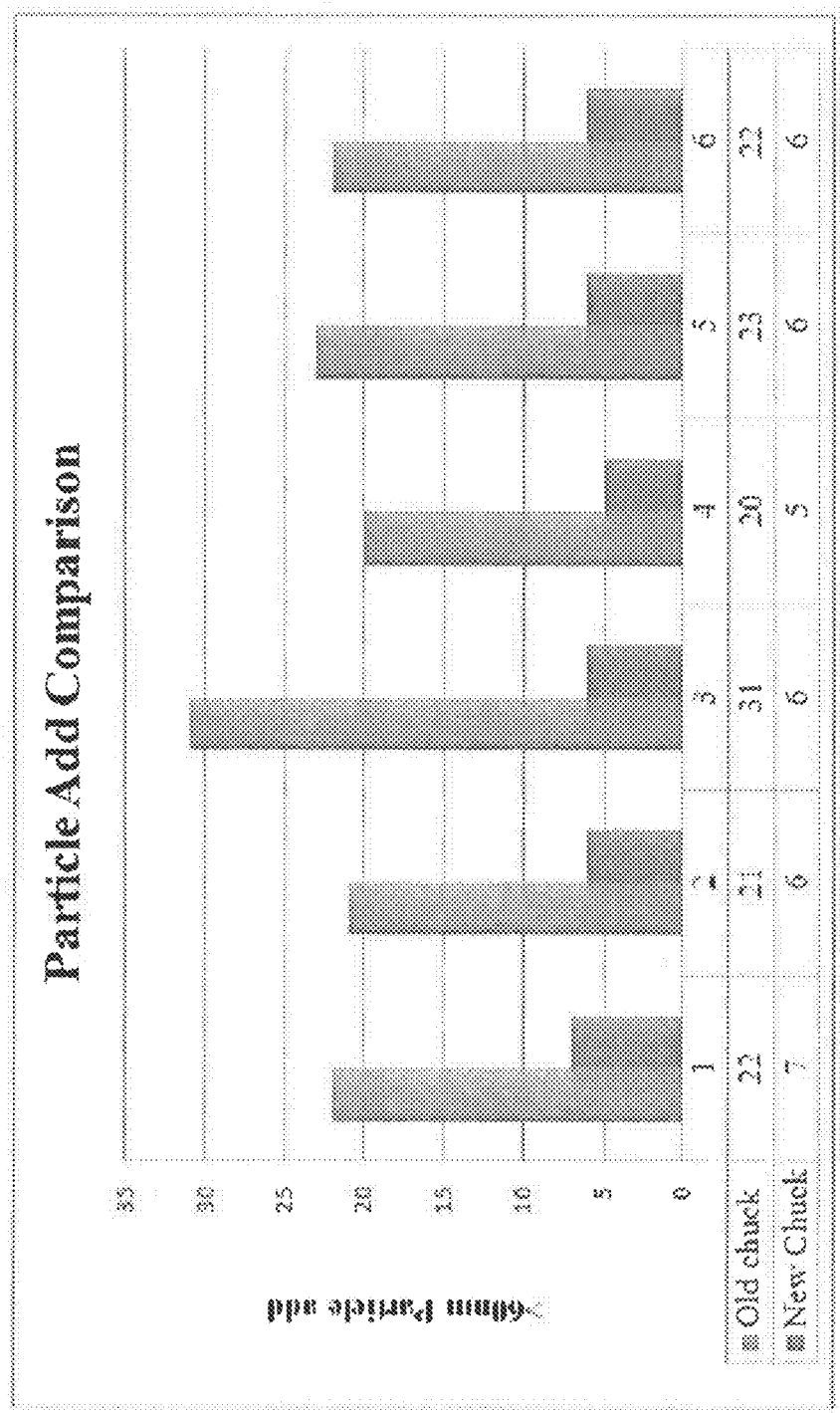
FIG. 24 shows a particle add comparison by using the substrate supporting apparatus shown in FIG. 8 and the substrate supporting apparatus shown in FIG. 14 to process a substrate.

FIG. 24 shows a particle add comparison by using the substrate supporting apparatus shown in FIG. 8 and the substrate supporting apparatus shown in FIG. 14 to process a substrate. In FIG. 24, the "Old chuck" is the substrate supporting apparatus shown in FIG. 8 and the "New Chuck" is the substrate supporting apparatus shown in FIG. 14. It can be seen from FIG. 24 that when using the substrate supporting apparatus shown in FIG. 14 to support the substrate for cleaning the back side of the substrate, the number of the particle add is obviously reduced.

The present invention utilizes the blocking wall 322 or 422 or 522 and the recess 324 defined on the rotary spindle 303 to prevent the particles in the spacing from entering the third gas groove 325, combining exhausting gas through the exhaust port 355, avoiding the particles reaching the third gas groove 325 and contaminating the front side of the substrate, which improves the quality of semiconductor devices.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A substrate supporting apparatus, comprising:
   a rotatable chuck for supporting a substrate, defining a plurality of first injecting ports and a plurality of second injecting ports, the first injecting ports connecting to a gas pipe for supplying gas to the substrate and sucking the substrate by Bernoulli effect, the second injecting ports connecting to another gas pipe for supplying gas to the substrate and lifting the substrate;
   a plurality of locating pins disposed at the top surface of the rotatable chuck, the plurality of locating pins being divided into a first group of locating pins and a second group of locating pins, every locating pin being driven by an independent cylinder, the cylinders which drive the first group of locating pins connecting to a gas pipe, the cylinders which drive the second group of locating pins connecting to another gas pipe;
   a hollow shaft, an inner wall of the hollow shaft defining four gas grooves, each gas groove configured to supply gas to a corresponding one of the gas pipes for supplying gas to the substrate and sucking the substrate by Bernoulli effect, the another gas pipe for supplying gas to the substrate and lifting the substrate, the gas pipe connecting to the cylinders which drive the first group of locating pins, or the another gas pipe connecting to the cylinders which drive the second group of locating pins;
   a rotary spindle, being set in the hollow shaft and a spacing formed between an outer wall of the rotary spindle and the inner wall of the hollow shaft;
   two pairs of seal rings, wherein one pair of seal rings is disposed at opposite sides of one gas groove which supplies gas to the cylinders for driving the first group of locating pins, one pair of seal rings is disposed at opposite sides of one gas groove which supplies gas to the cylinders for driving the second group of locating pins;
   wherein the hollow shaft defines an exhaust port between two adjacent gas grooves, wherein one gas groove supplies gas to the cylinders for driving the first group of locating pins or the second group of locating pins, one gas groove supplies gas to the first injecting ports or the second injecting ports, wherein the outer wall of the rotary spindle defines a blocking wall corresponding to the exhaust port of the hollow shaft and a recess matching the gas groove which supplies gas to the first injecting ports or the second injecting ports.

2. The substrate supporting apparatus as claimed in claim 1, wherein the blocking wall is in right angle, polygon or arc.

3. The substrate supporting apparatus as claimed in claim 1, wherein the rotary spindle connects to the rotatable chuck, and wherein the rotary spindle is configured to rotate in the hollow shaft, but the hollow shaft is non-rotating.

4. The substrate supporting apparatus as claimed in claim 1, wherein the four gas grooves are ring-shaped.

5. The substrate supporting apparatus as claimed in claim 1, wherein the hollow shaft defines four inlet ports, every inlet port connects to one gas groove.

6. The substrate supporting apparatus as claimed in claim 1, wherein the four gas pipes respectively rotate along with the rotary spindle when the rotary spindle is driven to rotate in the hollow shaft.

7. The substrate supporting apparatus as claimed in claim 1, wherein every first injecting port is inclined and formed an angle with respect to the bottom surface of the rotatable chuck.

8. The substrate supporting apparatus as claimed in claim 1, wherein every second injecting port is vertical and perpendicular to the rotatable chuck.

9. The substrate supporting apparatus as claimed in claim 1, wherein the two groups of locating pins are disposed alternately, the two groups of locating pins alternately position the substrate.

10. The substrate supporting apparatus as claimed in claim 1, further comprising a plurality of guiding pillars disposed at the top surface of the rotatable chuck, every guiding pillar protruding to form a holding portion for holding the substrate, the side surface of every guiding pillar serving as a guiding surface for guiding the substrate to be put on the holding portion exactly.

\* \* \* \* \*